(12) United States Patent
Takahashi et al.

(10) Patent No.: US 6,522,388 B1
(45) Date of Patent: Feb. 18, 2003

(54) VIBRATION ELIMINATOR, EXPOSURE APPARATUS AND PROJECTION EXPOSURE METHOD

(75) Inventors: Masato Takahashi, Tokyo (JP); Kazuya Ono, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/572,620

(22) Filed: May 17, 2000

Related U.S. Application Data

(63) Continuation of application No. PCT/JP98/05173, filed on Nov. 18, 1998.

(30) Foreign Application Priority Data

Nov. 18, 1997 (JP) .............................. 9-316955
Jan. 14, 1998 (JP) ........................... 10-006117

(51) Int. Cl.[7] ..................... G03B 27/42; G03B 27/58; G03B 27/62; F16M 13/00; G01M 3/32
(52) U.S. Cl. .................... 355/53; 355/72; 355/75; 248/550; 73/662
(58) Field of Search ...................... 355/30, 53, 72–76; 250/548–550; 378/34, 35; 310/10, 12; 73/587, 662–668; 356/399–401

(56) References Cited

U.S. PATENT DOCUMENTS

| | | | | |
|---|---|---|---|---|
| 5,155,523 A | * | 10/1992 | Hara et al. | 355/53 |
| 5,187,519 A | * | 2/1993 | Takabayashi et al. | 355/30 |
| 5,812,420 A | * | 9/1998 | Takahashi | 364/508 |
| 5,931,441 A | * | 8/1999 | Sakamoto | 248/550 |
| 6,036,162 A | * | 3/2000 | Hayashi | 248/550 |
| 6,038,013 A | * | 3/2000 | Ohsaki | 355/53 |

FOREIGN PATENT DOCUMENTS

| | | |
|---|---|---|
| JP | A-6-42578 | 2/1994 |
| JP | A 8-166043 | 6/1996 |
| JP | A-9-74061 | 3/1997 |
| JP | A-9-166176 | 6/1997 |
| JP | A-9-184536 | 7/1997 |

OTHER PUBLICATIONS

G. de Zwart et al., "Performance of a Step and Scan System for DUV Lithography", *Proceedings of SPIE*, vol. 3051, pp. 817–835, (1997).

* cited by examiner

*Primary Examiner*—Henry Hung Nguyen
(74) *Attorney, Agent, or Firm*—Oliff & Berridge, PLC

(57) ABSTRACT

The columns of an aligner are placed on a surface plate. Actuators are provided between the surface plate and leg parts of the column. Acceleration sensors are attached to the surface plate and the leg parts of the column near the leg parts of the column respectively. Relative vibrations in +/−z directions which are generated between the surface plate and the column are detected by the acceleration sensors and, in accordance with the detection results, driving forces generated by the actuators in +/−z directions are controlled. Further, vibration eliminators are attached to the important points of the surface plate, the column or a lower base and vibrations generated locally in the surface plate, the column or the lower base are reduced by the vibration eliminators.

13 Claims, 16 Drawing Sheets

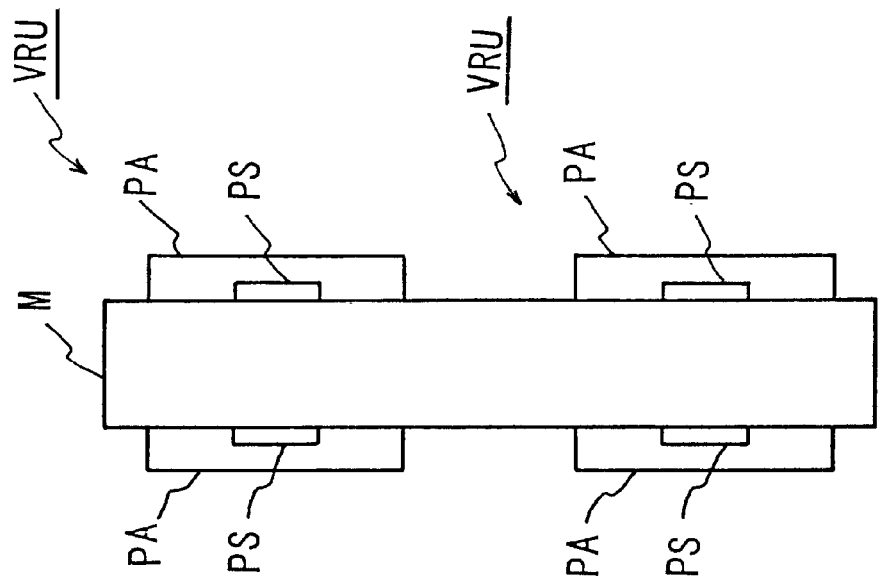
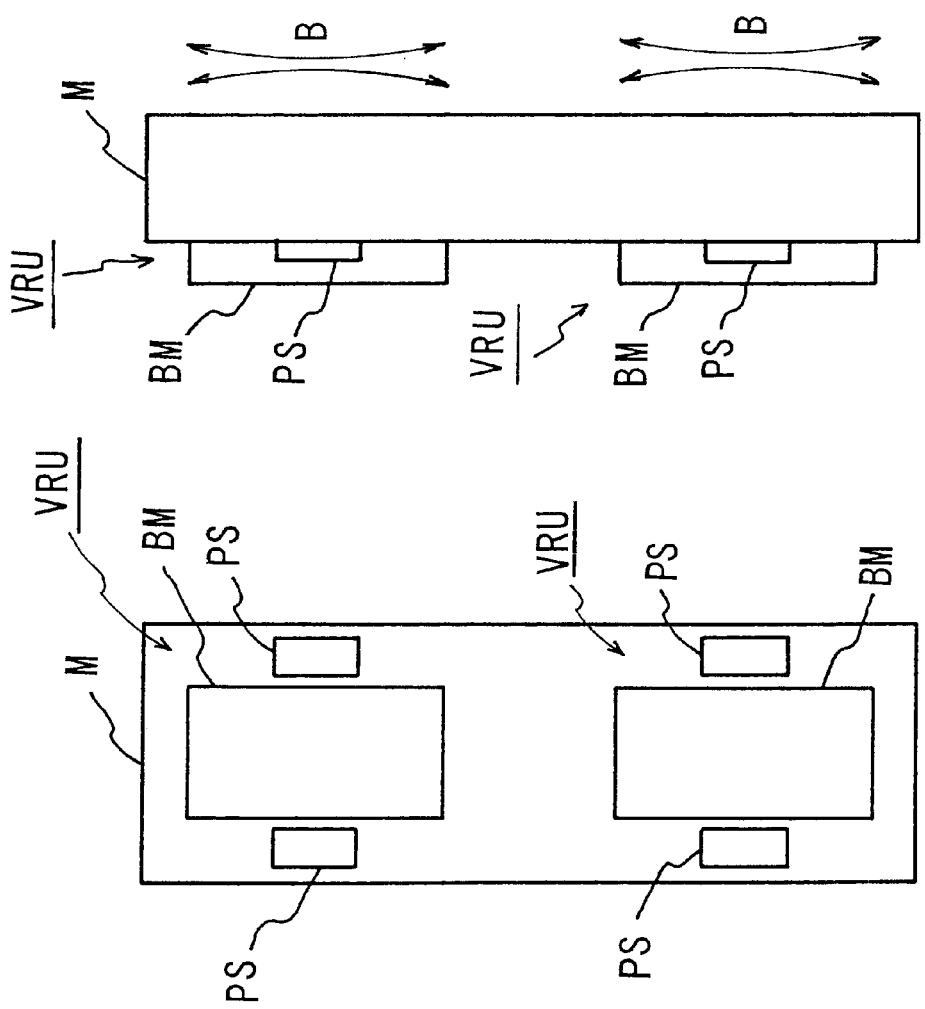
FIG. 16C
FIG. 16B
FIG. 16A

VIBRATION ELIMINATOR, EXPOSURE APPARATUS AND PROJECTION EXPOSURE METHOD

This application is a continuation of PCT International Application No. PCT/JP98/05173 filed Nov. 18, 1998.

The disclosures of the following priority applications are herein incorporated by reference: Japanese Patent Application No. 9-316955 filed Nov. 18, 1997 and, Japanese Patent Application No. 10-006117 filed January 14, 1998.

BACKGROUND OF THE INVENTION

1. Field of the Invention

The present invention relates to a vibration eliminator and an exposure apparatus, and more specifically, it relates to a vibration eliminator capable of reducing vibrations occurring within a structure supported by a vibration eliminating base, an exposure apparatus that employs the vibration eliminator and a projection exposure method achieved by employing the exposure apparatus.

2. Related Art

As a higher degree of accuracy is achieved in high precision apparatuses such as step-and-repeat type exposure apparatuses, i.e., so-called steppers, it has become necessary to block very slight vibrations imparted from the installation floor to the fundamental base (a vibration eliminating base) at a micro-G level. The various types of vibration eliminating pads including a mechanical damper achieved by placing a compressible coil spring in a damping fluid and a pneumatic damper are employed to support the vibration eliminating base of the vibration eliminator, and such a vibration eliminating pad itself has a certain degree of centering function. In particular, a pneumatic spring vibration eliminator provided with a pneumatic damper, which allows the spring constant to be set at a small value and is capable of blocking vibrations of approximately 10 Hz or more is utilized in a wide range of applications for supporting high precision apparatuses. In addition, active vibration eliminators have been proposed in recent years as a means for overcoming the limitations of passive vibration eliminators in the prior art (refer to Japanese Laid-Open Patent Publication No. H8-166043 submitted by the applicant of the present application, for instance). The vibration eliminator disclosed in the publication achieves vibration control by detecting vibrations of the vibration eliminating base with sensors and driving actuators in conformance with the outputs from the sensors and realizes ideal vibration insulation with no resonance peak in the low frequency control range.

In the vibration eliminator described above, the vibration eliminating base control loop is constituted by combining a velocity loop employed mainly for vibration elimination and a position loop implemented for positioning of the main unit. Six vibration sensors and six position sensors are mounted at the vibration eliminating base, and displacement and vibration along six degree of freedom directions detected by these sensors are converted to motion in six degree of freedom directions in the orthogonal coordinate system (coordinate system in mechanical design) which is set as appropriate during the vibration eliminator design stage and, based upon the results of the conversion, damping feedback control is implemented.

In addition, in order to prevent the vibration eliminating base from becoming excited by the reactive force generated as a stage repeats acceleration and deceleration on the vibration eliminating base, a force along the opposite direction achieving the same level as that of the reactive force (counter force) is input through feed-forward so that vibrations caused by stage acceleration and decelerations are reduced while maintaining good blockage of floor vibrations since it is not necessary to increase the position loop gain within the control loop.

The vibration eliminating base described above is designed on the premise that the apparatus mounted on the vibration eliminating base, which constitutes the source of vibration, vibrates together with the vibration eliminating base. In other words, by eliminating vibrations of the vibration eliminating base, which would try to vibrate together with the apparatus constituting the source of vibration, with the active vibration eliminator mentioned earlier, vibration damping is achieved for both the vibration eliminating base and the apparatus mounted at the vibration eliminating base.

The vibration eliminating base is controlled on the premise that the entire vibration eliminating base, i.e., the vibration eliminating base and the apparatus mounted on the vibration eliminating base, vibrates uniformly in a rigid mode without undergoing elastic deformation.

However, as the need for higher performance to be achieved by the vibration eliminating base increases, vibrations occurring on the vibration eliminating base in a local elastic mode can no longer be disregarded. The following is an explanation on vibrations occurring in the local elastic mode. Vibrations occurring in the local elastic mode refer to relative vibrations occurring between an apparatus or a structure mounted on the vibration eliminating base or the like and the vibration eliminating base itself and also local vibrations occurring as a result of elastic deformation of the vibration eliminating base.

If a vibration in the local elastic mode occurs, the vibration detected by a sensor mounted on the vibration eliminating base does not always match the vibration actually occurring on the vibration-eliminating base and, as a result, the effect of active vibration elimination is reduced.

In order to address the problem described above, it is necessary to reduce local vibrations occurring as a result of an elastic deformation of a member constituting the vibration eliminating base (hereafter referred to simply as the "member"). Vibrations occurring at the member is reduced by increasing the rigidity of the member or by constituting the member with a material achieving a high Young's modulus and a large damping coefficient such as a high attenuation cast iron, a typical example of which is FCD, in the prior art.

As further miniaturization of semiconductors is achieved necessitating an increase in the semiconductor exposure area, the overall size of exposure apparatuses has become larger. At the same time, the installation conditions under which an exposure apparatus is installed usually do not allow the exposure apparatus to become heavier. Thus, many exposure apparatuses in recent years adopt an open rib structure. There is a problem with such a rib structure, however, in that while the resonance frequency is high, a sufficient degree of rigidity is not achieved and, as a result, vibrations cannot be suppressed.

When a vibration occurs under such circumstances, this vibration in the local elastic mode becomes superimposed on the vibration detected by a sensor of the active vibration eliminator. This poses a concern that the vibration control system of the active vibration eliminator may be caused to vibrate, resulting in the active vibration eliminator exciting the vibration-eliminating base.

This is a problem that may occur at other various apparatuses in which vibrations must be eliminated, as well as at exposure apparatuses.

SUMMARY OF THE INVENTION

An object of the present invention, which has been completed to address the problem discussed above, is to provide a vibration eliminator achieving outstanding vibration-eliminating performance by reducing vibrations occurring in the local elastic mode at an apparatus or a structure mounted at the vibration eliminating base or at the vibration eliminating base itself, an exposure apparatus provided with the vibration eliminator and a projection exposure method achieved by employing the vibration eliminator.

In order to achieve the object described above, the vibration eliminator according to the present invention comprises a supporting member; a supported member that is supported by the supporting member; a drive device provided between the supporting member and the supported member, that generates a driving force along the support direction, in which the supporting member supports the supported member; a first vibration detector provided at the supporting member to detect a vibration of the supporting member along the support direction; a second vibration detector provided at the supported member to detect a vibration of the supported member along the support direction; and a damping control circuit that controls the driving force generated by the drive device based upon the vibrations detected by the first and second vibration detectors. According to the present invention, by controlling the driving force generated by the drive device provided between the supporting member and the supported member based upon the results of the supporting member vibration detection and the results of the supported member vibration detection, vibrations occurring at the supporting member and vibrations occurring at the supported member can both be reduced. In addition, since the relative vibrations occurring between the supporting member and the supported member are eliminated, the supporting member and the supported member can be integrated as if they were one rigid unit.

Furthermore, in the vibration eliminator according to the present invention, the damping control circuit reduces relative vibration occurring between the supporting member and the supported member by employing a velocity feedback loop constituted of an integrating circuit and a velocity control circuit to control the driving force generated by the drive device based upon the vibrations detected by the first and second vibration detectors. According to the present invention, since the relative vibration occurring between the supporting member and the supported member is controlled by the velocity feedback loop, optimal damping characteristics for reducing the vibration are achieved. In other words, damping control is achieved as if the vibrations were damped with a viscous resistance (damper). As a result, damping control is facilitated.

The vibration eliminator according to the present invention described above may further comprise a fixed body secured to the installation floor surface and a damping drive device that is provided between the supporting member and the fixed body or between the supported member and the fixed body. The damping control circuit controls the driving force generated by the damping drive device based upon the results of detection of a vibration occurring at the supporting member or the results of detection of a vibration occurring at the supported member. According to the present invention, by implementing damping drive on either one the supporting member and the supported member that are integrated as if they were a single rigid unit with local vibrations reduced, vibrations at the supporting member and the supported member can be reduced in an integrated manner.

The present invention is also adopted in an exposure apparatus that exposes an object to be exposed mounted on a stage with a predetermined pattern via a projection optical system. The exposure apparatus according to the present invention comprises a supporting member; a supported member that is supported by the supporting member; a drive device provided between the supporting member and the supported member, that generates a driving force along the support direction, in which the supporting member supports the supported member; a first vibration detector provided at the supporting member to detect a vibration of the supporting member along the support direction; a second vibration detector provided at the supported member to detect a vibration of the supported member along the support direction; and a damping control circuit that controls the driving force generated by the drive device based upon the vibrations detected by the first and second vibration detectors. According to the present invention, since local vibrations at the exposure apparatus are reduced with a high degree of reliability, the accuracy of the exposure apparatus is improved.

In addition, the present invention is also adopted in a projection exposure method for exposing an object to be exposed mounted on a stage with a predetermined pattern via a projection optical system. In the projection exposure method according to the present invention, relative vibration occurring between a supporting member and a supported member is reduced by controlling the output of a drive device provided between the supporting member and the supported member based upon the results of detection of a vibration in the supporting member occurring along the direction in which the supporting member supports the supported member and the results of a detection of a vibration in the supported member occurring along the support direction. According to the present invention, local vibrations occurring during projection exposure are reduced with a high degree of reliability to achieve highly accurate exposure.

In the projection exposure method according to the present invention, the output from a damping drive device provided between the supporting member and a fixed body or between the supported member and the fixed body is controlled based upon the results of detection of a vibration occurring in the supporting member or the results of detection of a vibration occurring in the supported member. According to the present invention, by reducing local vibrations to integrate the supporting member and the supported member as if they were a single rigid unit and then reducing vibrations by employing the damping drive device, vibrations of the overall apparatus are reduced. Thus, with the local vibrations and the overall vibrations occurring during projection exposure reduced, highly accurate exposure is achieved.

Alternatively, the vibration eliminator according to the present invention comprises a mechanical stress transducer provided at a surface of, or inside a member to convert strain in the member to electricity or magnetism and an energy converter that converts the electricity or the magnetism resulting from the conversion performed by the mechanical stress transducer to thermal energy. Thus, if vibrations cause the strain in the member, the mechanical stress transducer provided at a surface of, or inside the member converts the strain to electricity or magnetism. Then, the electricity or the magnetism resulting from the conversion performed by the mechanical stress transducer is converted to thermal energy by the energy converter. By converting vibrations occurring at the member to thermal energy and dissipating the thermal energy in this manner, vibrations of the member can be reduced.

In the vibration eliminator according to the present invention, the mechanical stress transducer includes a piezoelectric element or an electrostrictive element and the energy converter includes a resistor that shorts an electrode at the piezoelectric element or the electrostrictive element. In the vibration eliminator according to the present invention, if strain occurs due to vibrations in the member, the piezoelectric element or the electrostrictive element included in the mechanical stress transducer provided at a surface of, or inside the member converts the strain to electricity. Then, the electricity resulting from the conversion performed by the piezoelectric element or the electrostrictive element is further converted to thermal energy by the resistor constituting the energy converter. Furthermore, by employing the piezoelectric element or the electrostrictive element achieving a high degree of rigidity to constitute the mechanical stress transducer, no damage occurs or the rigidity of the entire member is not reduced even when the electromagnet transducer is mounted inside the member with a large mass and a relatively high degree of rigidity. By converting a vibration occurring in the member to thermal energy and consuming the thermal energy in this manner, the vibration can be reduced.

In the vibration eliminator according to the present invention, the mechanical stress transducer may include a magnetostrictive element and the energy converter may be provided with a coil in correspondence to the magnetostrictive element and a resistor that shorts the coil. Thus, if strain occurs in the member due to a vibration, the magnetostrictive element included in the mechanical stress transducer provided at a surface of, or inside the member converts the strain to magnetism. Then, the magnetism resulting from the conversion performed by the magnetostrictive element is further converted to electricity by the coil constituting the energy converter, and the electricity is converted to thermal energy by the resistor constituting the energy converter. By converting a vibration occurring in the member to thermal energy and consuming the thermal energy in this manner, the vibration can be reduced. Since the magnetostrictive element achieves a high degree of rigidity, no damage occurs or the rigidity of the entire member is not reduced even when the mechanical stress transducer is installed inside the member with a large mass and a relatively high degree of rigidity.

In addition, the mechanical stress transducer is provided at a position where the member becomes distorted to the greatest extent in the vibration eliminator according to the present invention. By providing the mechanical stress transducer at the position at which the member is distorted to the greatest extent, the conversion of a vibration occurring in the member to thermal energy and the consumption of the thermal energy can be achieved with the maximum degree of efficiency to reduce the vibration with the highest degree of efficiency.

The present invention is also adopted in an exposure apparatus that exposes an object to be exposed with an image of a pattern on a mask via a projection optical system. The exposure apparatus according to the present invention comprises a mechanical stress transducer provided at a surface of, or inside at least one of, a first supporting member that supports the projection optical system, a second supporting member that supports the mask and a third supporting member that supports a substrate, that converts strain in at least one of the first, second and third supporting members to electricity or magnetism and an energy converter that converts the electricity or the magnetism resulting from the conversion performed by the mechanical stress transducer to thermal energy. Thus, if strain occurs at, at least, one of the first, second and third supporting members due to a vibration, the mechanical stress transducer provided at a surface of or inside the supporting member converts the strain to electricity or magnetism. Then, the electricity or the magnetism resulting from the conversion performed by the mechanical stress transducer is converted to thermal energy by the energy converter. By converting a vibration occurring in the member to thermal energy and consuming the thermal energy in this manner, the vibration is reduced.

Alternatively, the vibration eliminator according to the present invention comprises a vibration eliminating base, a structure mounted on the vibration-eliminating base and a local vibration reduction device provided to reduce a vibration that occurs locally within the structure. Since the local vibration reduction device according to the present invention reduces a vibration occurring locally inside the structure, the vibration eliminating performance is improved.

In the vibration eliminator according to the present invention, the local vibration reduction device includes a mechanical stress transducer provided at a surface of, or inside a member constituting the structure, that converts strain in the member to electricity or magnetism and an energy converter that converts the electricity or the magnetism resulting from the conversion performed by the mechanical stress transducer to thermal energy. According to the present invention, by converting the strain in the member constituting the structure to electricity or magnetism and further converting the electricity or the magnetism to thermal energy, a vibration occurring in the member is reduced. Consequently, vibrations occurring locally in the structure can be reduced effectively.

In the vibration eliminator according to the present invention, the local vibration reduction device includes a strain detector that is provided at a surface of, or inside a member constituting the structure and detects strain occurring at the member to generate strain signal; an electrostrictive actuator provided at a surface of, or inside the member, that causes a displacement to an extent that corresponds to the level of an applied voltage; and a voltage control circuit that controls the voltage applied to the electrostrictive actuator based upon the strain signal output by the strain detector. According to the present invention, by controlling the displacement of the electrostrictive actuator provided at a surface of or inside the member in correspondence to the degree of strain in the member detected by the strain detector, a vibration occurring in the member can be reduced effectively.

In addition, in the vibration eliminator according to the present invention, the local vibration reduction device includes a mechanical stress transducer provided at a surface of, or inside a member constituting the structure, that converts strain in the member to electricity or magnetism, an energy converter that converts the electricity or the magnetism resulting from the conversion performed by the electromagnetic conversion element to thermal energy, a strain detector provided at a surface of, or inside the member, that detects strain occurring at the member to generate a strain signal, an electrostrictive actuator provided at a surface of, or inside the member, that causes a displacement to an extent that corresponds to the level of the applied voltage, and a voltage control circuit that controls the voltage applied to the electrostrictive actuator based upon the strain signal output by the strain detector if the absolute value of the strain signal output by the strain detector is larger than a predetermined value. According to the present invention, since the voltage control circuit controls the voltage applied to the electrostrictive actuator based upon the strain signal output by the strain detector if the absolute value of the strain signal output by the strain detector is larger than a predetermined value, in addition to converting strain in the member to electricity or magnetism by employing the mechanical stress transducer and converting the electricity or the magnetism to thermal energy by employing the energy converter, vibrations can be reduced even more effectively.

The present invention is also adopted in an exposure apparatus that exposes an object to be exposed mounted on a stage with a predetermined pattern via a projection optical system. The exposure apparatus according to the present invention comprises a vibration eliminating base, a structure mounted on the vibration-eliminating base and a local vibration reduction device provided to reduce vibrations locally occurring inside the structure. According to the present invention, in which vibrations occurring locally inside the structure constituting the exposure apparatus are reduced by the local vibration reduction device, the accuracy of the exposure apparatus is improved.

The present invention, through which vibrations occurring at a structure on a vibration eliminating base can be reduced, may be adopted in a vibration eliminating base and an exposure apparatus to demonstrate superior damping capability. In addition, the present invention may be utilized in an exposure apparatus that performs exposure by using a charged particle beam, an optical bench such as an interferometer that measures profile irregularities of a test piece with a high degree of accuracy, a vibration-free, ultra precise machine tool and the like.

BRIEF DESCRIPTION OF THE DRAWINGS

FIG. 16A shows the vibration eliminator mounted at a member;

FIG. 16B is a side view of the member shown in FIG. 16A;

FIG. 16C presents another example in which the vibration eliminator is mounted at a member.

DESCRIPTION OF THE PREFERRED EMBODIMENTS

First Embodiment

Figure 1A:
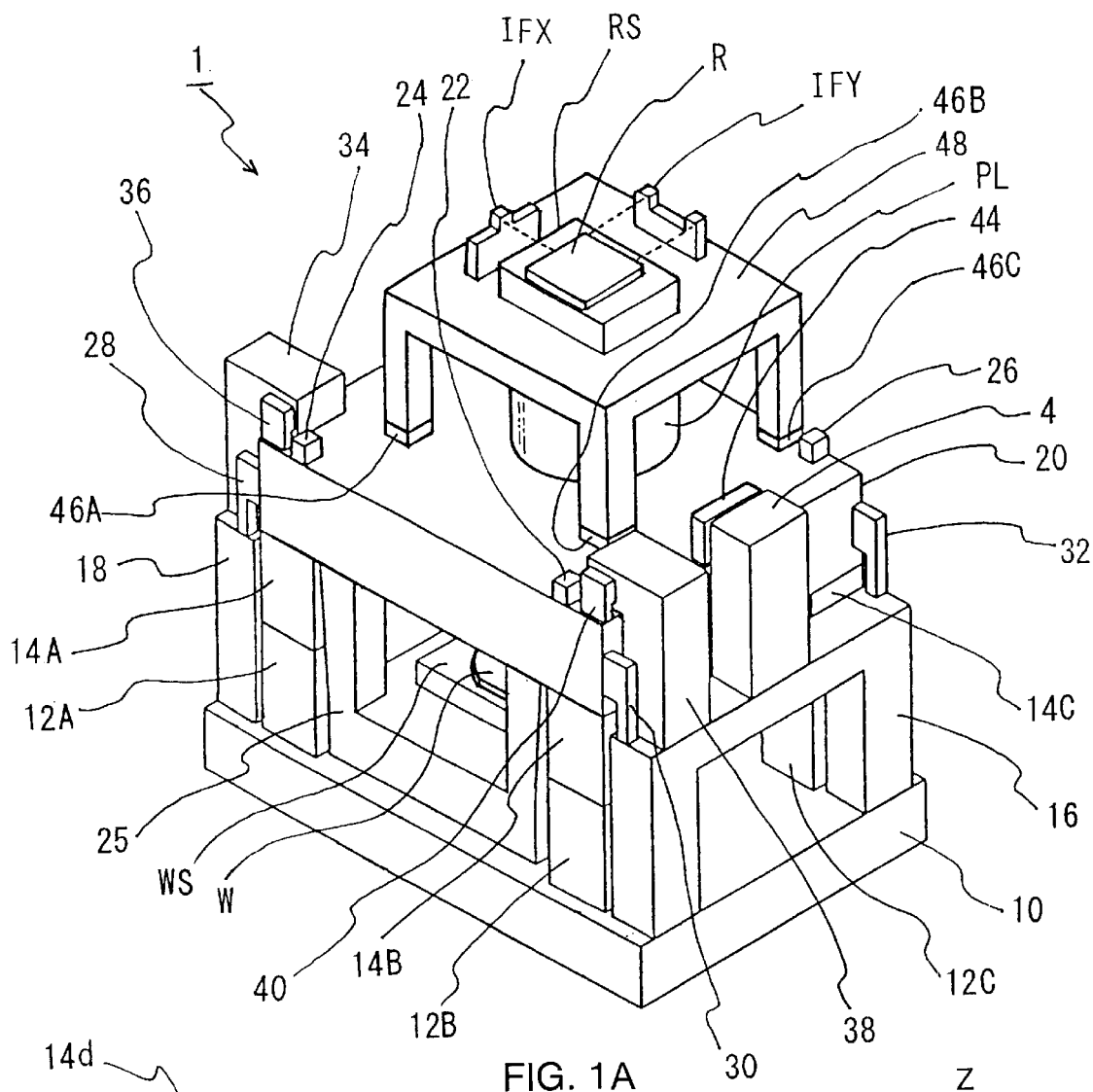
FIG. 1A illustrates a schematic structure of the exposure apparatus in a first embodiment.
Figure 1B:
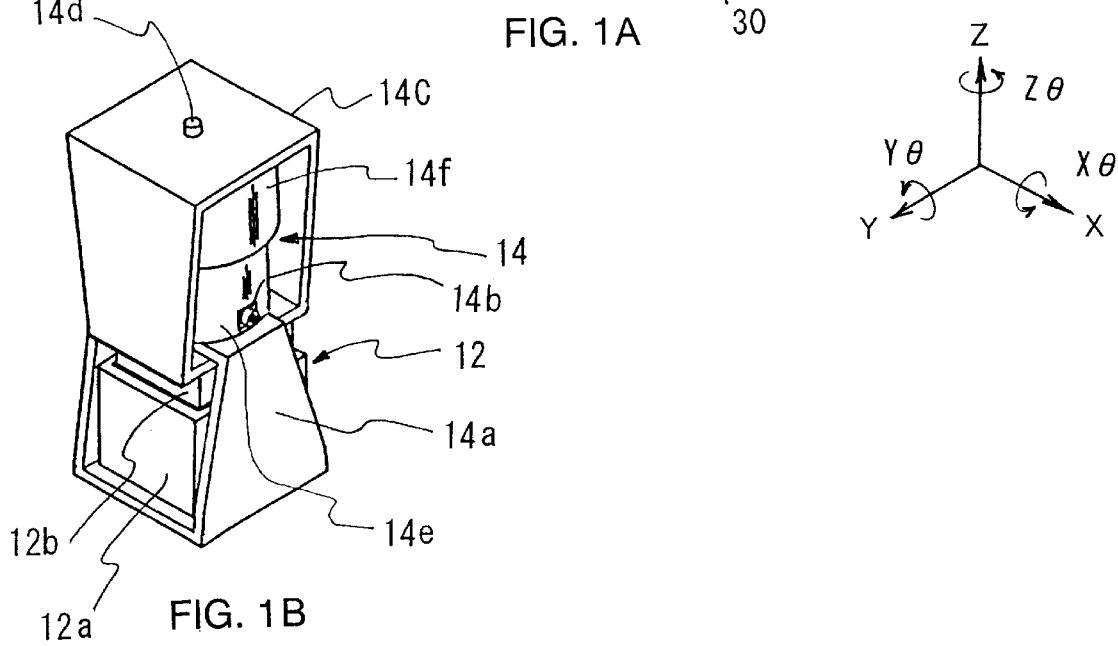
FIG. 1B illustrates a schematic structure of the VCM and the air mount.

The following is an explanation of the first embodiment of the present invention, given in reference to FIGS. 1~5. It is to be noted that with regard to this embodiment:
(i) The structure of an exposure apparatus adopting the present invention;
(ii) Reduction of vibrations in the rigid mode (hereafter referred to as rigid vibrations); and
(iii) Reduction of local vibrations in an elastic mode (hereafter referred to as local vibrations) are explained.
In the following explanation of (iii) reduction of local vibrations characterizes the present invention.
(i) Structure of Exposure Apparatus FIG. 1A illustrates a schematic structure of a step- and-scan type exposure apparatus 1 in the embodiment of the present invention. In FIG. 1A, a rectangular pedestal 10 is placed on a floor that constitutes the installation surface, and voice-coil motors (hereafter referred to as VCM) 12A~12D (the VCM 12D toward the far end in the drawing, not shown in FIG. 1A) are mounted on the pedestal 10. Air mounts 14A~14D (the air mount 14D at the far end in the drawing, not shown in FIG. 1A) are mounted on the VCMs 12A~12D respectively and a rectangular fundamental base 20 constituting a vibration eliminating base is set on the air mounts 14A~14D. Since in the embodiment a projection optical system PL is employed as detailed later, a Z axis is taken parallel to the optical axis of the projection optical system PL, an X axis is taken along the longitudinal direction of the fundamental base 20 within a plane perpendicular to the Z axis and a Y axis is taken along a direction perpendicular to the X axis, in this structure. In addition, the rotating directions around the individual axes are set as the Zθ direction, the Xθ direction and the Yθ direction respectively. It is to be noted that in the following explanation, the directions of the individual arrows indicating the X, Y and Z axes in FIG. 1 are referred to as the +X direction, the +Y direction and the +Z direction with the directions opposite from them referred to as the −X direction, the −Y direction and the −Z direction respectively for distinction as necessary.

One set of a VCM and an air mount constituted of the VCMs 12A~12D and the air mounts 14A~14D is provided near each of the four corners of the fundamental base 20. The VCMs 12A~12D and the air mounts 14A~14D are now explained in reference to FIG. 1B. It is to be noted that since the VCMs 12A~12D are structured identically to one another and the air mounts 14A~14D are structured identically to one another, the following explanation is given categorically on a VCM 12 and an air mount 14.

The VCM 12 is constituted of a fixed part 12a, a movable part 12b and the like. The fixed part 12a is secured inside a stationary frame body 14a at the bottom and the movable part 12b is linked with a movable frame body 14c. The air mount 14 is constituted of a fixed part 14e, a movable part 14f and the like. The fixed part 14e of the air mount 14 is secured onto the stationary frame body 14a, whereas the movable part 14f is linked with the movable frame body 14c. By this structure, any thrust generated from the VCM 12 and the air mount 14 is transmitted to the movable frame body 14c. The thrust of the VCM 12 is adjusted by a control unit 2 (see FIG. 3; the control unit 2 is to be explained in detail later). Compressed air from an air pressure source (not shown) is supplied to the air mount 14 via an air supply hole 14b. The control unit 2 (see FIG. 3) adjusts the thrust generated from the air mount 14 by adjusting the quantity of air supplied to the air mount 14. A peg 14d projecting out at the top surface of the movable frame body 14c fits in a hole (not shown) formed at the bottom surface of the fundamental base 20 for positioning.

At the ends of the upper surface of the fundamental base 20 along the +Y direction, acceleration sensors 22 and 24, as vibration sensors are secured. In addition, at an end of the upper surface of the fundamental base 20 along the −Y direction, an acceleration sensor 26 is secured. Vibrations of the fundamental base 20 are detected by the acceleration sensors 22, 24 and 26. Furthermore, near the two ends of the side surface of the fundamental base 20 along the +X direction, displacement sensors 30 and 32 as position sensors are secured, with a displacement sensor 28 secured at the side surface of the fundamental base 20 along the −X direction. Portal-shaped frames 16 and 18 are secured onto the pedestal 10, and the displacement sensors 28, 30 and 32 detect relative displacement occurring between the frame 16 and the fundamental base 20 or between the frame 18 and the fundamental base 20. These acceleration sensors and displacement sensors are all connected to the control unit 2 (see FIG. 3).

Figure 2:
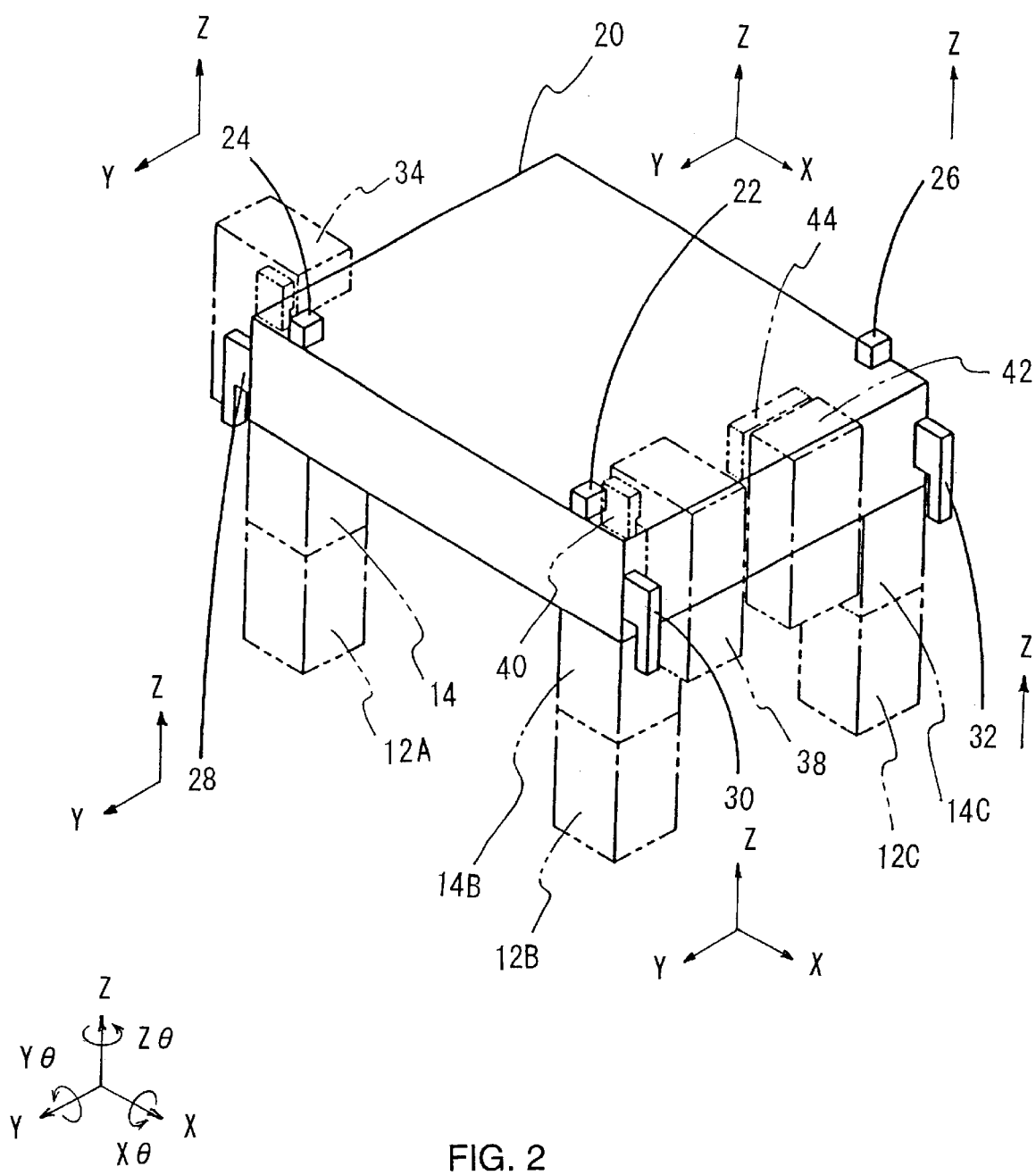
FIG. 2 illustrates positions at which the acceleration sensors and the displacement sensors are provided and the directions along which their sensitivity manifests.

Now, in reference to FIG. 2, the directions in which vibrations are detected by the acceleration sensors 22, 24 and 26 and the directions in which displacement are detected by the displacement sensors 28, 30 and 32 are explained. FIG. 2 illustrates the fundamental base 20 of the projection exposure apparatus in FIG. 1 and the sensors secured to the fundamental base 20. The acceleration sensor 22 is constituted of three acceleration sensors to detect acceleration in the ±X direction, the ±Y direction and the ±Z direction. The acceleration sensor 24 is constituted of two acceleration sensors to detect acceleration in the ±Y direction and the ±Z direction. The acceleration sensor 26 is constituted of a sensor that detects acceleration in the ±Z direction. Likewise, the displacement sensor 30 is constituted of three displacement sensors to detect displacement in the ±X direction, the ±Y direction and the ±Z direction. The displacement sensor 28 is constituted of two displacement sensors to detect displacement in the ±Y direction and the ±Z direction. The displacement sensor 32 is constituted of a sensor that detects displacement in the ±Z direction. It is to be noted that whenever it is necessary in the following explanation, the acceleration sensors for detecting acceleration in the ±Y direction and the ±Z direction constituting the acceleration sensor 24, for instance, are respectively referred to as acceleration sensors 24Y and 24Z. Likewise, the individual displacement sensors are referred to as displacement sensors 30X 30Y and 30Z, for instance. The method of detecting vibration and displacement occurring at the fundamental base 20 by employing the acceleration sensors and the displacement sensors is to be explained later.

Again in reference to FIG. 1, the structure of the exposure apparatus 1 is explained. The projection optical system PL passes through the fundamental base 20 and is secured to the fundamental base 20. A column 48 is set on the fundamental base 20 so as to enclose the projection optical system PL, and a reticle R is mounted on the upper plate of the column 48 with a reticle stage RS. Actuators 46A~46D capable of generating thrust along the ±Z direction (the actuator 46D is not shown in FIG. 1) are provided between the fundamental base 20 and the column 48. The actuators 46A~46D are provided to achieve the local vibration reduction which characterizes the present invention. The functions of the actuators 46A~46D are to be detailed later.

At the bottom of the fundamental base 20, a lower base 25 is suspended. A substrate stage (wafer stage) WS, which is driven in the XY two-dimensional direction by a drive device (not shown) is mounted on the lower base 25. In addition, a wafer W, which constitutes a photosensitive substrate is vacuum-held on the wafer stage WS via a Z leveling stage, a θstage and a wafer holder (none shown). The wafer W is three-dimensionally positioned by the Z leveling stage (not shown) which is capable of driving the wafer W along the Z axis direction and adjusting its inclination relative to the Z axis and the θstage (not shown), which is capable of rotating the wafer W by a very small angle around the Z axis.

The positional adjustment of the reticle R is achieved by a fine adjustment mechanism which engages in fine adjustment of the position of the reticle stage RS along the Y axis direction and a rotating angle fine adjustment mechanism (neither shown). In addition, the reticle stage RS is driven in the X direction by a drive device (not shown). As the reticle stage RS is driven, the position of the reticle R is detected by laser interferometers IFX and IFY.

An illuminating optical system (not shown) is provided over the reticle R. A main control device (not shown) implements relative alignment for the reticle R and the wafer W and autofocusing by employing a focal point detection system (not shown). Then, a pattern on the reticle R illuminated with exposure illuminating light emitted by the illuminating optical system is projected by the projection optical system PL onto the individual shot areas at the wafer W which are sequentially exposed with the illuminated pattern. In the exposure apparatus in the embodiment, during the exposure of each shot area, the main control device (not shown) implements relative scanning of the wafer stage WS and the reticle stage RS at a specific velocity ratio along the X axis direction (scanning direction) via their respective drive device.

A Y actuator 34 secured at the top of the frame 18, and a Y actuator 38 and an X actuator 42, secured at the top of the frame 16 are explained. The Y actuators 34 and 38 are provided to impart thrust to the fundamental base 20 in the +Y direction and the X actuator 42 is provided to impart thrust to the fundamental base 20 along the ±X direction. At the upper surface of the fundamental base 20, blocks 36, 40 and 44 are secured facing opposite the corresponding actuators. Thrust forces generated by the individual actuators are transmitted to the fundamental base 20 via the respective blocks facing opposite the actuators. The Y actuators 34 and 38 and the X actuator 42 may each be constituted of an electromagnetic actuator comprising a magnet, a coil and the like. The Y actuators 34 and 38 and the X actuator 42 are connected to the control unit 2 (see FIG. 3) and the thrusts generated by the individual actuators are controlled by the control unit 2.

Figure 4:
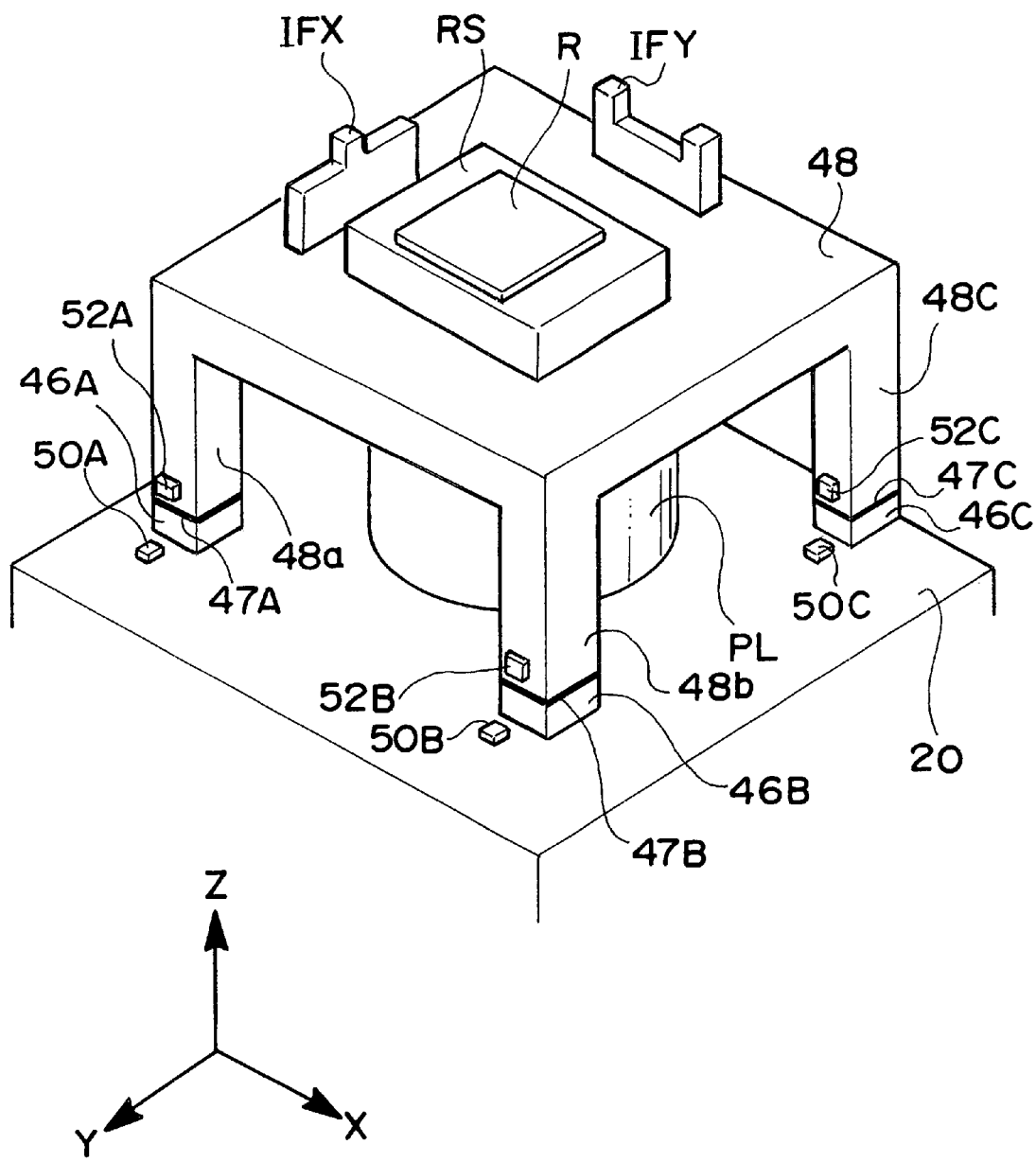
FIG. 4 illustrates the positions at which the acceleration sensors and the actuators are provided.

The actuators 46A~46D provided between the fundamental base 20 and the column 48 and the like are now explained in reference to FIG. 4, which illustrates the area above the fundamental base 20.

In FIG. 4, the actuators 46A~46D and hard rubbers 47A~47D (the actuator 46D and the hard rubber 47D located at the far end of the drawing not shown in FIG. 4) are provided between leg parts 48a~48d (the leg part 48d located at the far end of the drawing not shown in FIG. 4) constituting the column 48 and the fundamental base 20. In addition, in the vicinity of the mounting positions at which the leg parts 48a~48d of the column 48 are mounted on the upper surface of the fundamental base 20 and in the lower portions of the leg parts 48a–48d of the column 48, acceleration sensors 50A~50D and acceleration sensors 52A~52D as vibration sensors (the acceleration sensors 50D and 52D located at the far end of the drawing not shown in FIG. 4) are respectively provided. These acceleration sensors detect vibrations along the ±Z direction.

The acceleration sensors 50A~50D and 52A~52D are all connected to the control unit 2 (see FIG. 5), and signals corresponding to local vibrations of the fundamental base 20 and the column 48 detected by the acceleration sensors are input to the control unit 2.

Figure 5:
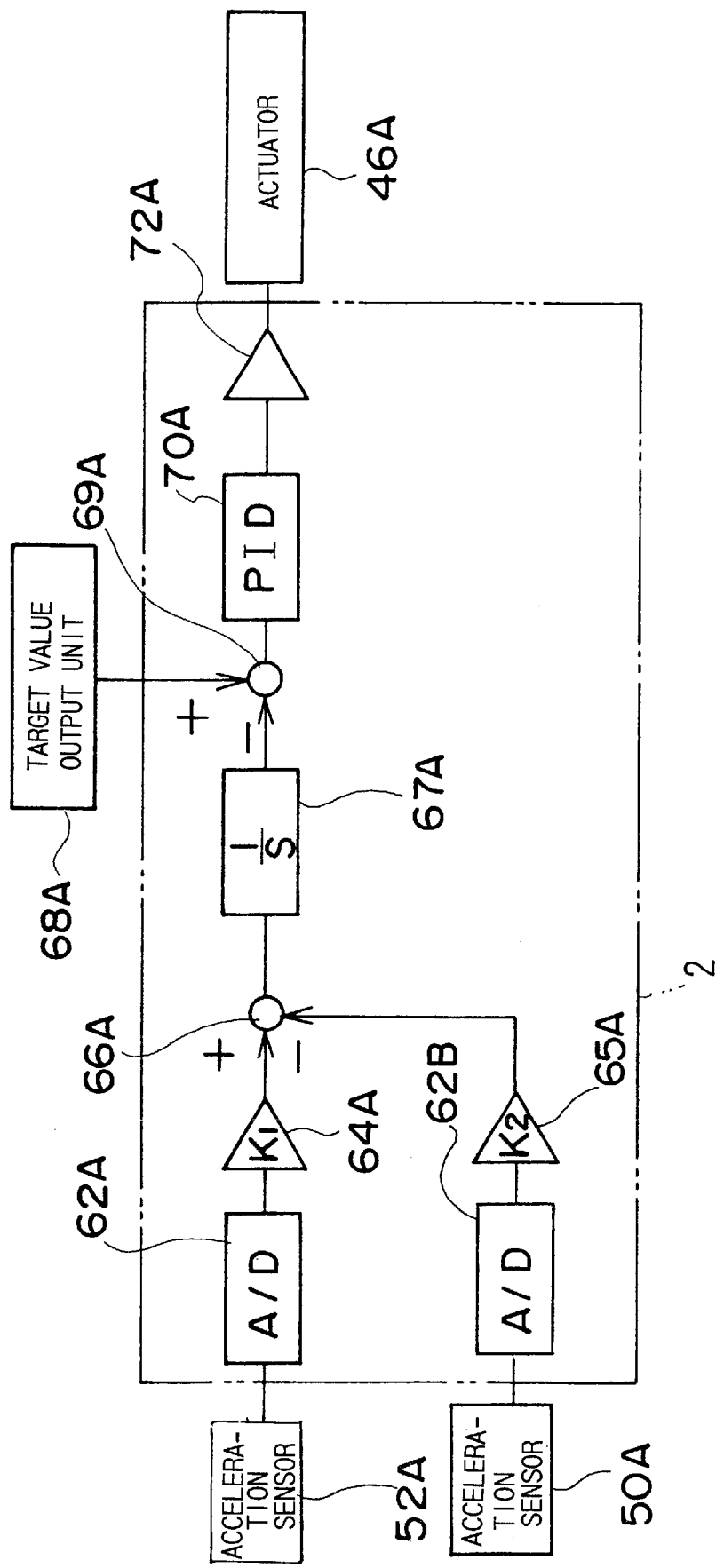
FIG. 5 is a block diagram of the control system provided to reduce local vibrations.

The actuators 46A~46D are connected to the control unit 2 (see FIG. 5). The actuators 46A~46D are enabled to generate thrust along the ±Z direction in FIG. 4 in conformance with the control implemented by the control unit 2 (see FIG. 5). The actuators 46A~46D may be each constituted of, for instance, a piezoelectric actuator. The hard rubbers 47A~47D are provided to prevent any damage to the actuators 46A~46D from occurring when an impulsive force (displacement) is generated between the fundamental base 20 and the column 48.

Again in reference to FIG. 1, the adjustment of the height and the horizontal level of the fundamental base 20 performed when installing the exposure apparatus 1 is briefly explained. Signals indicating a ±Z direction displacement (height) of the fundamental base 20 detected by the displacement sensors 28, 30 and 32 is input to the control unit 2 (see FIG. 3). Based upon these signals, the control unit 2 (see FIG. 3) sets the height of the fundamental base 20 to a predetermined value and at the same time, calculates the thrusts that should be imparted by the air mounts 14A~14D to maintain the horizontal level. Then, the control unit 2 (see FIG. 3) adjusts the quantities of air to be supplied to the individual air mounts from the air pressure source (not shown) so that the calculated thrusts are generated by the air mounts 14A~14D. Afterwards, the control unit 2 (see FIG. 3) continues to control the thrusts generated by the air mounts 14A~14D so that the height and the horizontal level of the fundamental base 20 are sustained. Thus, no strain is generated at the fundamental base 20 and, in addition, a high degree of positioning accuracy is achieved for the reticle stage RS and the wafer stage WS.

As explained above, the fundamental base 20, the wafer stage WS, the column 48, the projection optical system PL, the reticle stage RS and the like constitute the exposure apparatus 1 in the embodiment.

(ii) Reduction of Rigid Vibrations

Figure 3:
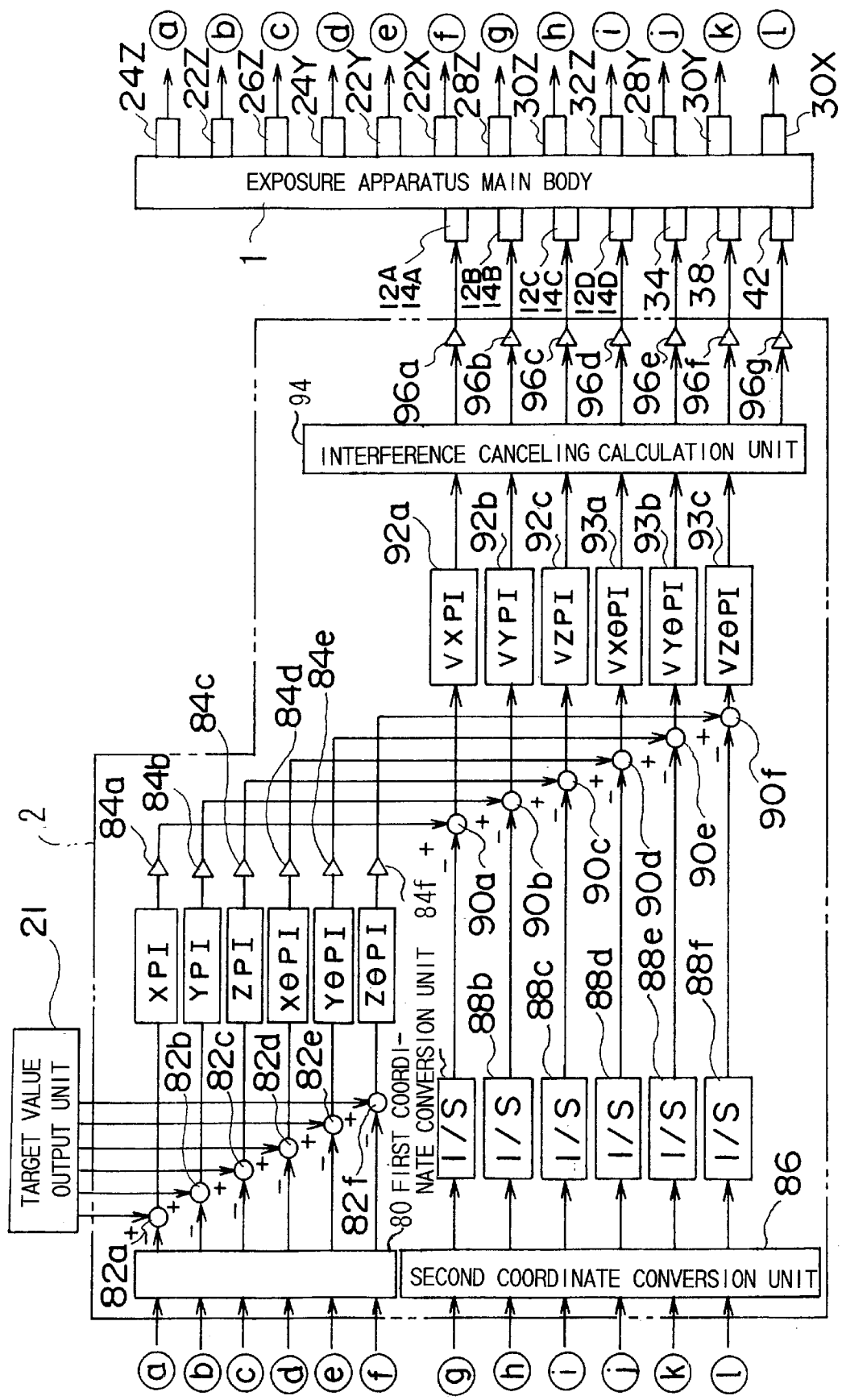
FIG. 3 is a block diagram of the control system provided to reduce rigid vibrations.

Next, the control implemented by the control unit 2 to reduce rigid vibrations of the exposure apparatus 1 is explained in reference to the circuit block diagram presented in FIG. 3. The control unit 2, which is constituted of a computer (not shown), controls thrusts generated by the VCMs 12A~12D, the Y actuators 34 and 38 and the X actuator 42 so as to reduce rigid vibrations of the exposure apparatus 1 (see FIG. 1) that includes the fundamental base 20 based upon outputs from the displacement sensors 28, 30 and 32 and the acceleration sensors 22, 24 and 26.

The control unit 2 comprises a first coordinate transformation unit 80, six subtractors 82a~82f, position controllers XPI, YPI, ZPI, XθPI, YθPI and ZθPI, six velocity conversion gains 84a~84f, a second coordinate transformation unit 86, six integrators 88a~88f, six subtractors 90a~90f, velocity controllers VXPI, VYPI, VZPI, VXθPI, VYθPI and VZθPI, an interference canceling calculation unit 94 and seven thrust gains 96a~96g. The first coordinate transformation unit 80 receives output signals from the displacement sensors 28Y, 28Z, 30X, 30Y, 30Z and 32Z (see FIG. 2) via A/D converters (not shown) and converts the signals thus received to quantities of displacement (x, y, z, θx, θy, θz), of the exposure apparatus 1 along six degree of freedom directions (X, Y, Z, Xθ, Yθ, Zθ: see FIG. 1). The subtractors 82a~82f respectively subtract the displacement quantities (x, y, z, θx, θy, θz) along the six degree of freedom directions resulting from the conversion performed by the first coordinate transformation unit 80 from control target values (x0, y0, z0, θx0, θy0, θz0) output by a target value output unit 21 to calculate positional deviations (Δx=x0-x, Δy=y0-y, Δz=z0-z, Δθx=θx0-θx, Δθy=θy0-θy, Δθz=θz0-θz) along the individual six degree of freedom directions. The position controllers XPI, YPI, ZPI, XθPI, YθPI and ZθPI are constituted of PI controllers that engage in control operations by using operation signals or positional deviations Δx, Δy, Δz, Δθx, Δθy and Δθz along the individual six degree of freedom directions in an inertial principle axis coordinate system. The velocity conversion gains 84a~84f respectively converts the outputs from the position controllers XPI, YPI, ZPI, XθPI, YθPI and ZθPI to velocity command values x0', y0', z0', θx0', θy0' and θz0'

The second coordinate transformation unit 86 receives outputs from the acceleration sensors 22X, 22Y, 22Z, 24Y, 24Z and 26Z (see FIG. 2) via A/D converters (not shown) and converts the outputs thus received to accelerations (x", y", z", θx", θy", θz") along the individual six degree of freedom directions. The six integrators 88a~88f respectively integrate the acceleration components (x", y", z", θ"x, θ"y, θ"z) along the six degree of freedom directions resulting from the conversion performed by the second coordinate transformation unit 86 to convert them to velocity components (x', y', z', θ'x, θ'y, θ'z) in the individual directions. The six subtractors 90a~90f subtract the outputs (x', y', z', θ'x, θ'y, θ'z) of the integrators 88a~88f from the velocity command values (x0', y0', z0', θ'x0, θ'y0, θ'z0) output by the velocity conversion gains 84a~84f to calculate velocity deviations (Δx'=x0'-x', Δy'=y0'-y', Δz'=z0'-z', Δθ'x =θ'x0-θ'x, Δθ'y=θ'y0-θ'y, Δθ'z=θ'z0-θ'z) along the individual six degree of freedom directions. The velocity controllers VXPI, VYPI, VZPI, VXθPI, VYθPI and VZθPI, which are constituted of PI controllers that engage in control operations by using operation signals or the velocity deviations θx', Δy', Δz', Δθ'x, Δθ'y and Δθ'z along the individual six degree of freedom directions, implement velocity control along the individual six degree of freedom directions. The interference canceling calculation unit 94 performs an arithmetic operation to achieve non-interference in order to convert the velocity control quantities output by the velocity controllers VXPI, VYPI, VZPI, VXθPI, VYθPI and VZθPI to velocity command values indicating velocities that should be generated at the positions of the individual actuators. The thrust gains 96a~96g respectively convert the velocity command values indicating velocities to be generated at the individual actuator positions resulting from the conversion performed by the interference canceling calculation unit 94 to values of thrusts to be generated at the individual actuators.

As described above, the control system in which the control unit 2 implements control to reduce rigid vibrations is constituted as multiplex loop control system having an inner loop, i.e., the velocity control loop comprising the acceleration sensors, the integrators, the velocity controllers and the like provided inside the position control loop comprising the displacement sensors, the position controllers and the like. Through this control system, by implementing a control with distribution of the driving forces of the plurality of actuators so that the fundamental base 20 is driven along 6 degrees of freedom direction, external vibrations are effectively blocked to reduce vibrations without having to raise the gain at the position control loop or increase the servo rigidity.

(iii) Reduction of Local Vibrations

In reference to FIG. 5, the control implemented by the control unit 2 to reduce local vibrations of the exposure apparatus 1 is explained. FIG. 5 is a block diagram illustrating the connection of the acceleration sensors 50A~50D and 52A~52D and the actuators 46A~46D (see FIG. 4) to the control unit 2. It is to be noted that FIG. 5 only illustrates connections of the acceleration sensors 50A and 52A and the actuator 46A to the part of the control unit 2 which is engaged in the local vibration reduction control. While the acceleration sensors 50B~50D and 52B~52D and the actuators 46B~46D are connected with the control unit 2 in a similar manner, the illustration of their connections is omitted.

The control unit 2 receives a signal corresponding to the vibration level output by the acceleration sensor 52A and converts the signal thus received to digital data by employing an A/D converter 62A. Then, the digital data is inputted to a subtractor 66A via a multiplier 64A with a gain K1. The gain K1 is determined based upon the mass of the entire column 48 including the object mounted on the column 48 and the elastic coefficient (or the hardness) of the hard rubber 47A.

In addition, the control unit 2 receives a signal corresponding to the vibration level output by the acceleration sensors 50A and converts the signal thus received to digital data by employing an A/D converter 62B. Then, the digital data is inputted to a subtractor 66A via a multiplier 65A with a gain K1. The gain K2 is determined based upon the natural frequency inherent to the fundamental base 20. The subtractor 66A detects the difference between the data output by the multiplier 64A and the data output by the multiplier 65A, and the difference is input to an integrator 67A where it is converted to a velocity value. The output from the integrator 67A is input to a subtractor 69A. In addition, an output from the target value output unit 68A (output from the target value output unit 68A in the embodiment is equal to 0) is input to the subtractor 69A. The velocity deviation ascertained by the subtractor 69A is input to a PID controller 70A. The PID controller 70A performs a control operation by using an operation signal or the output from the subtractor 69A. The control quantity output by the PID controller 70A is converted to a velocity command value indicating a velocity to be generated by the actuators 46A at a multiplier 72A, and is then output to the actuator 46A.

The method of local vibration reduction described above achieved by the control unit 2 may be summarized as follows. Namely, a) signals (supporting member vibration signals) output by the acceleration sensors 50A~50D provided at the fundamental base 20 based upon the results of detection of a vibrations of the fundamental base 20 along the ±Z direction (the direction along which the fundamental base 20 supports the column 48) are received, b) signals (supported member vibration signals) output by the acceleration sensors 52A~52D provided at the column 48 based upon the results of detection of a vibrations of the column 48 along the ±Z direction are received, and c) based upon the signals input from the acceleration sensors 50A~50D and 52A~52D, thrust generated by the actuators (drive device) provided between the fundamental base 20 and the column 48 are controlled to reduce local vibrations.

As shown in FIG. 5, the control system through which local vibrations are reduced by the control unit 2 is constituted as the velocity control loop comprising the acceleration sensors, the integrator, the velocity controller and the like. During the control process, the acceleration sensors 50A and 52A detect vibrations at the fundamental base 20 and the leg part 48a of the column 48 via the actuators 46A and the hard rubber 47A to achieve an improvement in the detection accuracy with which relative of vibrations occurring between the fundamental base 20 and leg part 48a of the column 48 are detected. As a result, even when the fundamental base 20 itself undergoes elastic deformation and vibrates, or even when relative vibrations occur between the column 48 and at the fundamental base 20, vibrations can be reduced effectively.

While an example in which vibrations detected by the acceleration sensors 50A and 52A are reduced by the control unit 2 through control of thrust generated by the actuators 46A is explained in reference to FIG. 5 above, similar control is implemented by the control unit 2 on the other actuators 46b~46D independently of each other.

In an exposure apparatus in the prior art, the degrees of rigidity of the individual elements constituting the exposure apparatus are increased to reduce occurrence of local vibrations by raising the rigidity of the exposure apparatus main unit and, in addition, a great number of fastening parts are utilized and a great deal of care is taken to increase the joint strength to ensure that local vibrations do not occur at the area where the reticle stage RS, the fundamental base 20 and the column 48 are joined, for instance. In contrast, according to the present invention, in which vibrations that occur are effectively eliminated by utilizing the actuators, superior-damping performance is achieved even though the joining method itself is simpler than that in the prior art.

While an explanation is given above in reference to the embodiment on an example in which local vibrations are reduced at the area where the fundamental base 20 and the column 48 are joined, the present invention may be adopted in other areas. Namely, the present invention may be adopted to great advantage at a portion that should be ideally set at a location mechanically cut off from the exposure apparatus main unit to isolate vibrations but cannot be set at such a location due to structural restrictions. For instance, the present invention may be adopted at an area where the lower base 25 (see FIG. 1) at which the wafer stage WS having the movable parts such as the Z leveling stage and the θ stage, and the fundamental base 20 are joined. It may also be adopted in the area where the actuator (not shown) for Z leveling is mounted. In addition, in the step-and-scan type exposure apparatus in the embodiment of the invention, an actuator for driving a variable illuminating field aperture (reticle blind) (neither shown) is provided at the illuminating optical system. By adopting of the present invention in the area where the actuator is mounted or the like, vibrations generated by the actuator can be reduced.

The explanation is given above in reference to the embodiment on an example in which the actuators 46A~46D are driven to reduce relative vibrations occurring between the fundamental base 20 and the column 48. Instead of this vibration eliminating method, vibration of one of the plurality of members that are bonded via an actuator may be detected to operate the actuator based upon the detected vibration. Namely, a type of dynamic damper may be constituted with the actuator and another member connected via the actuator. In this case, while relative vibrations occurring between the one member and the other member are not reduced, vibrations of the one member are effectively reduced.

In addition, in the explanation given above on the embodiment, the acceleration sensors 50A~50D and 52A~52D (see FIG. 4) only detect vibrations in the ±Z direction i.e., along the direction in which the fundamental base 20 supports the column 48 (the support direction), and the actuators 46A~46D, generate only thrust along the ±Z direction. However, the present invention is not limited to this example, and the exposure apparatus according to the present invention may be provided with sensors capable of detecting vibrations occurring along a direction other than the support direction mentioned above and actuators that impart thrust along the direction in which the vibrations can be reduced. By adopting such a structure, local vibrations occurring along a direction other than the ±Z direction can be reduced.

Furthermore, in the explanation given above on the embodiment, vibrations are reduced by handling the entire exposure apparatus 1 including the fundamental base 20 and the column 48 as a rigid body based upon the outputs from the acceleration sensors 22, 24 and 26 (see FIG. 1) in an explanation of (ii) the rigid vibration reduction. In addition, based upon the outputs from the acceleration sensors 50A~50D and 52A~52D (see FIG. 4) employing for (iii) the local vibration reduction, vibrations of the fundamental base 20 and the column 48 are individually reduced. Since the acceleration sensors 22, 24 and 26 that detect vibrations along the Z direction are provided on the fundamental base 20 in this structure, these acceleration sensors 22, 24 and 26 may also function in combination with the acceleration sensors 50A~50D. In the structure having the acceleration sensors 22, 24 and 26 at the column 48, the acceleration sensors 22, 24 and 26 may be utilized in combination with the acceleration sensors 52.

It is to be noted that in the explanation given above on the embodiment, the Y actuators 34 and 38 and the X actuator 42 secured onto the frames 16 and 18 drive the fundamental base 20 to achieve active vibration elimination and reduce rigid vibration. However, the Y actuator 34 and 38 and the X actuator 42 may drive the column 48, instead.

While the vibration eliminator according to the present invention is employed in a projection exposure apparatus which performs step-and-scan type scanning exposure in the embodiment explained above, the vibration eliminator according to the present invention may be also adopted in an ideal manner in a step-and-repeat type projection exposure apparatus, in which a stage moves on its fundamental base.

Moreover, the vibration eliminator in the embodiment may be employed in a charged particle beam exposure apparatus as well as in an optical exposure apparatus as explained in reference to the embodiment.

Second Embodiment

Figure 6:
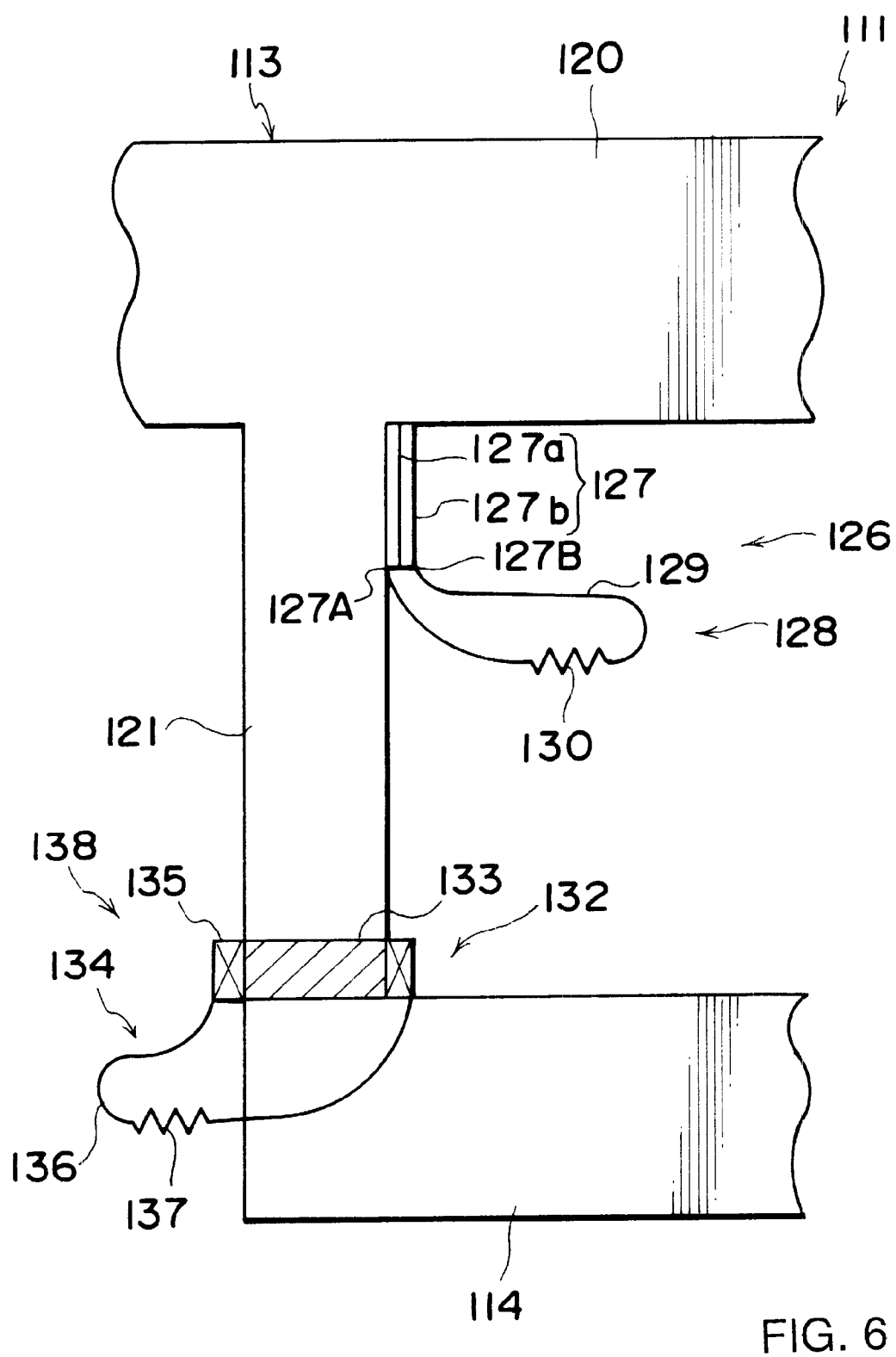
FIG. 6 is a partial enlargement of the exposure apparatus in a second embodiment of the present invention.
Figure 7:
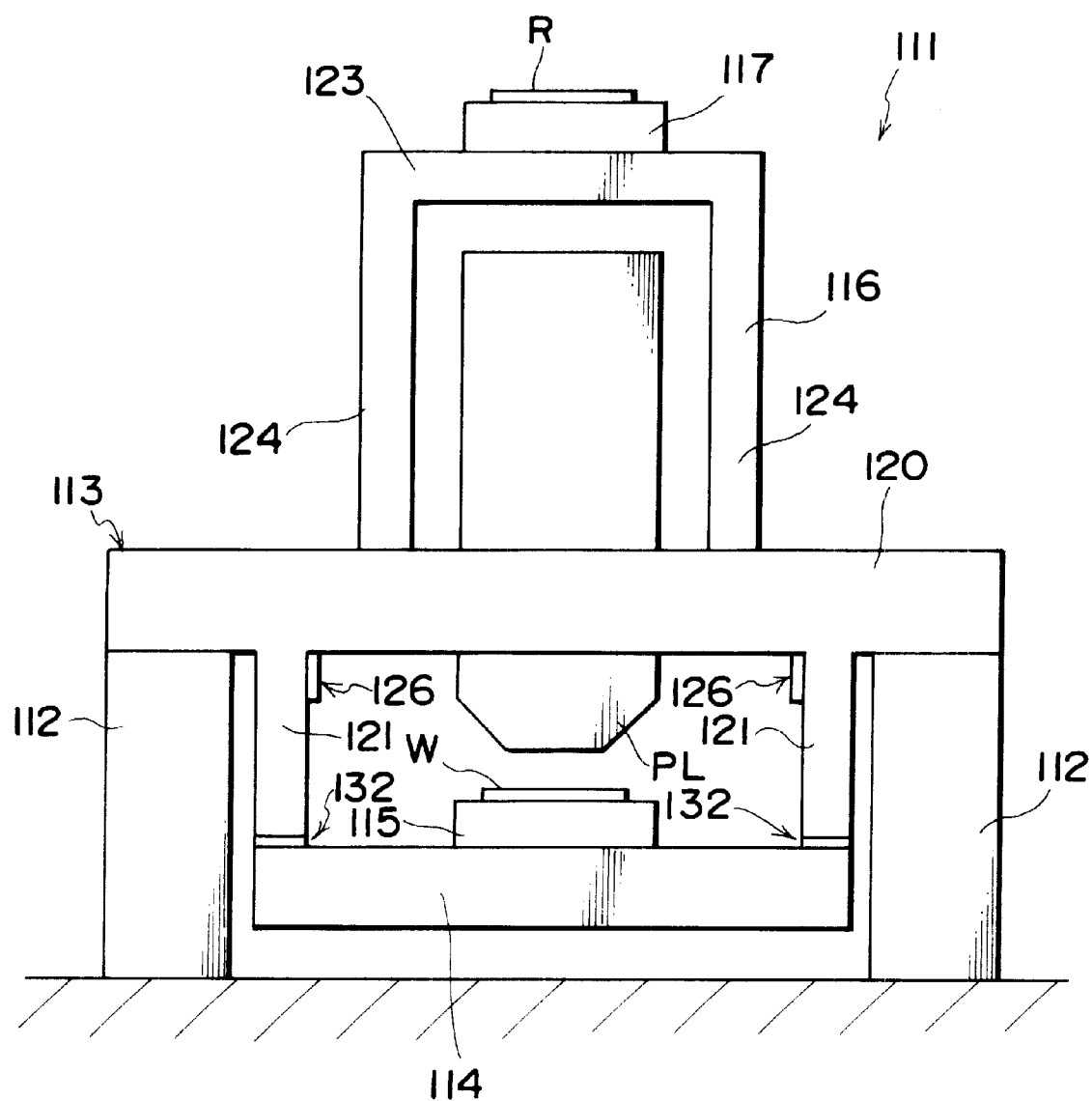
FIG. 7 is a front view of the overall structure of the exposure apparatus in the second embodiment of the present invention.
Figure 8:
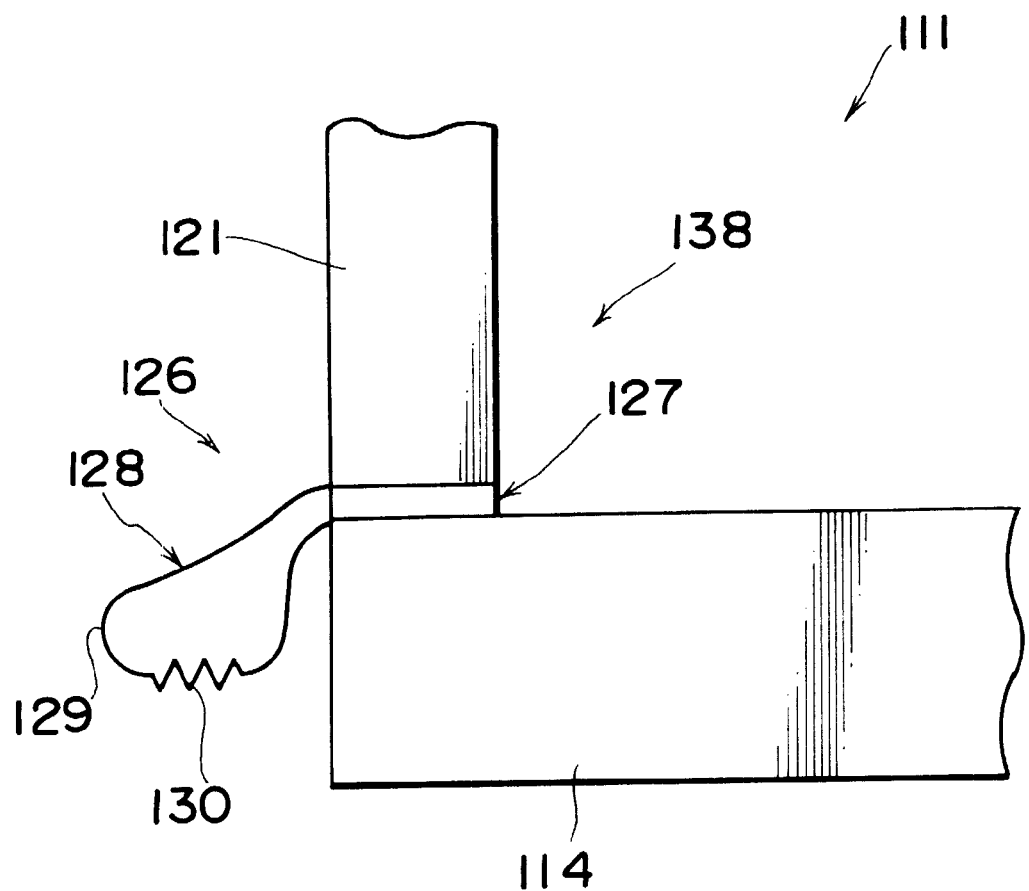
FIG. 8 is a partial enlargement of an example of a variation of the second embodiment of the present invention.

The following is an explanation of the second embodiment of the present invention, given in reference to FIGS. 6~8. In reference to FIG. 7, which illustrates the overall structure of an exposure apparatus 111, the exposure apparatus 111 is first explained.

The exposure apparatus 111 comprises vibration eliminators 112, a first column 113, a projection lens PL, a stage fundamental base 114, a wafer stage 115, a second column 116 and a reticle stage 117 on which a reticle R is mounted.

A plurality of vibration eliminators 112, which reduce vibrations, are provided at specific positions on the floor constituting the installation surface. The first column 113 includes a plate portion (first supporting member) 120 and a plurality of suspended posts 121.

The plate portion 120, which is constituted as a flat plate, is supported at each corner by one of the vibration eliminators 112. The suspended posts 121 extend downward from the plate portion 120 at positions further inward relative to the vibration eliminators 112. The projection lens PL is secured at a central area of the plate portion 120 further inward relative to the suspended posts 121.

The stage fundamental base 114 is supported at the lower ends of the suspended posts 121 of the first column 113, and in this state, the stage fundamental base 114 is set above the floor by a specific distance. The wafer stage 115, which moves the wafer W constituting the substrate along the horizontal direction and the vertical direction is mounted on the stage fundamental base 114.

The second column (second supporting member) 116 includes a plate portion 123 and a plurality of leg parts 124. The plate portion 123 is constituted as a flat plate and at each of its corners, one of the leg parts 124 extends downward. The second column 116 is provided on the plate portion 120 of the first column 113 with the leg parts 124 surrounding the projection lens PL. The reticle stage 117, which moves the reticle R constituting the mask, is mounted on the plate portion 123 of the second column.

When performing projection exposure on the wafer W, the exposure apparatus 111 structured as described above controls the position of the wafer W relative to the projection lens PL by moving the reticle stage 117 and the wafer stage 115 in synchronization with each other and the wafer W is exposed with an image of the mask pattern on the reticle R through scanning via the projection lens PL.

While the first column 113, the second column 116 and the like are mounted on the vibration eliminators 112, vibrations from the floor cannot be completely eliminated, and slight vibrations are imparted to the projection optical system PL, the wafer stage 115 and the reticle stage 117. In addition, if the drive system of the wafer stage 115 and the reticle stage 117 are provided at the first column 113, the second column 116 or the like, the reactive forces occurring when the wafer stage 115 and the reticle stage 117 are moved are imparted to the first column 113, the second column 116 and the like. Furthermore, even when the drive systems for the wafer stage 115 and the reticle stage 117 are provided at a reaction frame (not shown) which is separate from the exposure apparatus 111, reactive forces are generated at the reaction frame when the wafer stage 115 and the reticle stage 117 are moved, and vibrations occurring at the reaction frame generate at the first column 113, the second column 116 and the like via the floor and the vibration eliminators 112. In addition, as the wafer stage 115 and the reticle stage 117 move, the center of gravity of the entire exposure apparatus 111 fluctuates to cause the exposure apparatus 111 to become skewed, which generates internal strain at the first column 113, the second column 116 and the like. Thus, strains attributable to vibrations and the like occur at the first column 113, the second column 116 and the like.

At the surface of each suspended post 121 of the first column 113 toward the projection lens PL, a first vibration eliminator 126 is mounted. As illustrated in FIG. 6, the first vibration eliminator 126 comprises a piezoelectric element 127 as an electro-mechanical conversion element and an energy consumption circuit 128.

The piezoelectric element 127 is a so-called bimorph element achieved by laminating two element bodies 127a and 127b each formed as a plate with each other. The element body 127a is pasted onto the surface of the first column 113 at the base of the suspended post 121 over its entire surface. If a strain attributable to at least one of flexure, stretching and torsion, occurs at the suspended post 121, the piezoelectric element 127 too, becomes strained. When such a strain occurs at the piezoelectric element 127, the piezoelectric element 127 generates a potential difference between specific positions. Thus, the piezoelectric element 127 converts the strain occurring at the suspended post 121 to electricity. The two positions of the piezoelectric element 127 between which such a potential difference occurs are set at two electrodes 127A and 127B.

The energy consumption circuit 128 comprises a lead wire 129 that shorts the two electrodes 127A and 127B of the piezoelectric element 127 from each other and a resistor 130 provided within the lead wire 129. Thus, the energy consumption circuit 128 employs the resistor 130 to convert the potential difference generated at the piezoelectric element 127 to thermal energy and consumes it.

In addition, as illustrated in FIG. 7, a second vibration eliminator 132 is mounted between each of the suspended posts 121 of the first column 113 and the stage fundamental base 114.

As illustrated in FIG. 6, the second vibration eliminator 132 is provided with a magnetostrictive element 133 as an element converting strain to magnetism and an energy consumption circuit 134.

The magnetostrictive element 133 is provided between the suspended post 121 and the stage fundamental base 114. It is assumed that the suspended posts 121 and the stage fundamental base 114 constitute a single stage supporting member (third supporting member) 138. If a strain attributable to at least one of; flexure, stretching and torsion, occurs at the stage component 138, the magnetostrictive element 133 provided inside also becomes strained. When such a strain occurs, the magnetostrictive element 133 generates a magnetic field around itself. Thus, the magnetostrictive element 133 converts the strain occurring at the stage supporting member 138 to magnetism. The magnetostrictive element 133 employed in this structure has a high degree of rigidity and a Young's modulus of 5000~20,000 kgf/mm². As a result, even though the magnetostrictive element 133 is mounted between the suspended post 121 and the heavy stage fundamental base 114, no damage occurs or the rigidity of the stage supporting member 138 is not reduced either.

The energy consumption circuit 134 comprises a coil 135 set at a position at which an induced current can be generated from the magnetic field generated by the magnetostrictive element 133, a lead wire 136 that shorts the two ends of the coil 135 from each other and a resistor 137 provided in the middle of the lead wire 136. More specifically, the coil 135 is wound around the magnetostrictive element 133 while allowing for a specific clearance.

Thus, the energy consumption circuit 134 converts change occurring in the magnetic field generated by the magnetostrictive element 133 to an electric current by employing the coil 135, and further converts the electrical current to thermal energy by employing the resistor 137 and consumes the thermal energy.

A vibration attributable to a movement or the like of the wafer stage 115, for instance, has been transmitted to a suspended post 121 of the first column 113 from the stage fundamental base 114 in the exposure apparatus 111 structured as described above. The component of this vibration along the horizontal direction causes a strain mainly attributable to flexure or torsion at the suspended post 121 and the piezoelectric element 127 of the first vibration eliminator 126 pasted in the area becomes likewise strained. As a result, the piezoelectric element 127 generates a potential difference between the two electrodes 127A and 127B. This potential difference causes an electrical current to flow to the resistor 130 of the energy consumption circuit 128, and the electrical current is converted to thermal energy by the resistor 130 and is then consumed. By converting the strain energy resulting from the vibration to thermal energy and consuming it in this manner, the vibration is reduced.

In this structure, in order to achieve the optimal damping performance which corresponds to the vibration characteristics and the like of the exposure apparatus 111, the electrostatic capacities of the piezoelectric elements 127 and the resistance values of the resistors 130 are adjusted. Through such simple adjustments, the optimal damping performance is achieved.

In addition, the component of the vibration along the vertical direction generates a strain mainly attributable to stretching at the stage supporting member 138 constituted of the stage fundamental base 114 and the first column 113. As a result, a similar strain occurs at the magnetostrictive element 133 of the second vibration eliminator 132, which in turn causes the magnetostrictive element 133 to generate a magnetic field. Such a change in the magnetic field causes an induced current to flow to the coil 135 of the energy consumption circuit 134, and the electrical current is converted to thermal energy by the resistor 137 and is consumed. By converting the strain energy resulting from the vibration to thermal energy and consuming it in this manner, the vibration is damped.

In this structure, in order to achieve the optimal damping performance which corresponds to the vibration characteristics and the like of the exposure apparatus 111, the expansion ratio of the magnetostrictive elements 133 and the resistance value of the resistor 137 are adjusted. Through such simple adjustment, the optimal damping performance is achieved.

It is to be noted that the highest degree of strain occurs at the surface of the first column 113 at the base of the suspended post 121 when a vibration along the horizontal direction attributable to movement of the wafer stage 115 or the like is transmitted from the stage fundamental base 114 to the suspended posts 121. Accordingly, the piezoelectric element 127 of the first vibration eliminator 126 is pasted onto this area.

Since the piezoelectric element 127 is provided at the area of the first column 113 where the suspended post 121 is subject to the highest degree of strain as described above, conversion of a vibration occurring at the first column 113 to thermal energy and the consumption thereof are achieved with the highest degree of efficiency to realize the reduction of the vibration with the highest degree of efficiency as well.

Since the surface of the first column 113 near the middle point of each suspended post 121 is also subject to the highest degree of strain when a vibration occurring along the horizontal direction is communicated from the stage fundamental base 114 to the suspended posts 121, the piezoelectric element 127 may be pasted onto this area instead.

It is to be noted that in the explanation above, the piezoelectric element 127 of the first vibration eliminator 126 is provided at the suspended post 121 of the first column 113 and the magnetostrictive element 133 of the second vibration eliminator 132 is provided between the suspended post 121 of the first column 113 and the stage fundamental base 114. However, the present invention is not limited to this example, and the piezoelectric element 127 may be provided at any position at the first column 113, the stage fundamental base 114 or the second column 116 as long as it is set at a position suited for reducing vibrations (ideally at a position at which a vibration-induced strain manifests to the maximum degree). In addition, the magnetostrictive element 133 may be provided at any of the positions mentioned above.

For instance, as illustrated in FIG. 8, the first vibration eliminator 126 may be provided in place of the second vibration eliminator 132. More specifically, the piezoelectric element 127 instead of the magnetostrictive element 133 may be provided between the suspended post 121 of the first column 113 and the stage fundamental base 114 with an energy consumption circuit 128 having a lead wire 129 and a resistor 130 as described above provided at the piezoelectric element 127.

In addition, the piezoelectric element 127 of the first vibration eliminator 126 or the magnetostrictive element 133 of the second vibration eliminator 132 may be provided between the second column 116 and the reticlel stage 117 column 113, or the piezoelectric element 127 of the first vibration eliminator 126 may be provided at the surface of the second column 116.

In addition, the piezoelectric element 127 of the first vibration eliminator 126 or the magnetostrictive element 133 of the second vibration eliminator 132 may be provided between the second column 116 and the first column 113, or the piezoelectric element 127 of the first vibration eliminator 126 may be provided at the surface of the plate portion 120 of the first column 113.

It is to be noted that since the piezoelectric element 127 and the magnetostrictive element 133 both have a high degree of rigidity, no damage occurs or the overall rigidity is not reduced even when they are provided inside a member with great mass and a relatively high degree of rigidity as described above.

Moreover, advantages similar to those described above can be achieved by using an electrostrictive element instead of the piezoelectric element 127 in the first vibration eliminator 126.

In addition, the piezoelectric element 127 of the first vibration eliminator 126 or the magnetostrictive element 133 of the second vibration eliminator 132 may be provided between the second column 116 and the reticle stage 117, or the piezoelectric element 127 of the first vibration eliminator 126 may be provided at the surface of the second column 116.

Third Embodiment

Figure 9B:
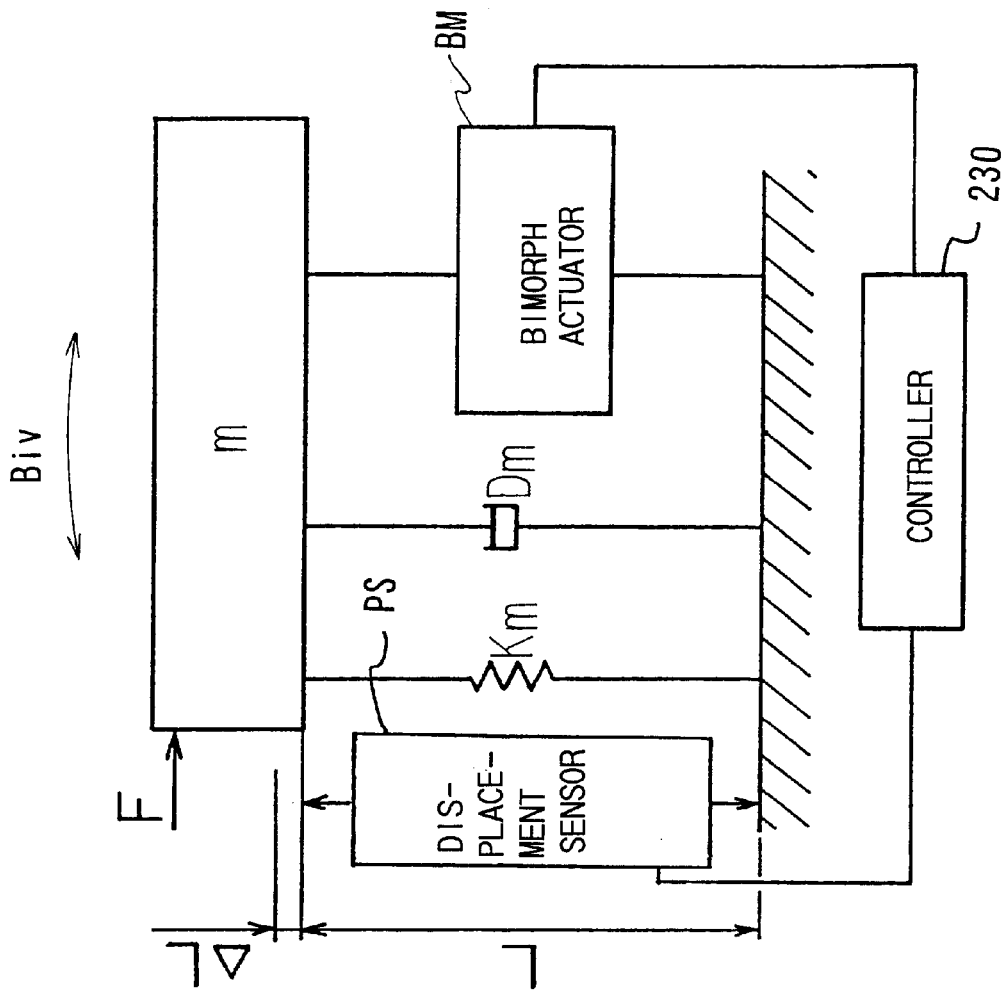
FIG. 9B illustrates an equivalent vibration model for the components and the vibration eliminator shown in FIG. 9A.
Figure 9A:
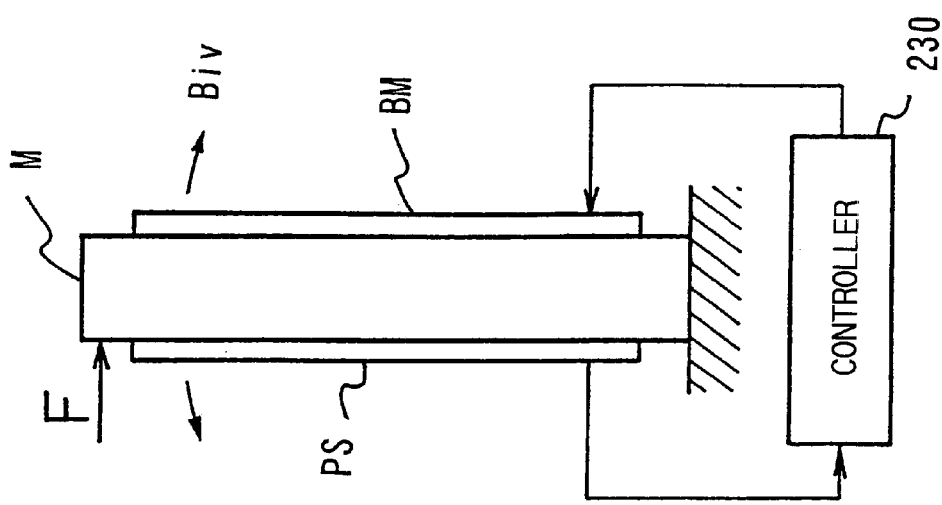
FIG. 9A schematically illustrates the vibration eliminator, which is one of the components of the exposure apparatus in a third embodiment of the present invention.

In FIG. 9A, which schematically illustrates the vibration-eliminating principal adopted in the vibration eliminator in the third embodiment, a cantilever member M is a schematic representation of a member that constitutes a structure mounted on a vibration-eliminating base. At one surface of the member M, displacement sensors PS is secured with bimorph actuators BM secured onto another surface.

The displacement sensors PS, which may be constituted of, for instance, a piezoelectric sensor that utilizes the piezoelectric phenomenon, outputs a signal corresponding to the quantity of strain occurring at the member M. In other words, if the force F is imparted to the member M to generate a vibration along the direction indicated by the arrows Biv, a signal corresponding to the quantity of strain at the member M caused by the vibration is output, and thus, the displacement sensors PS can be utilized as a vibration sensor.

Figure 10A:
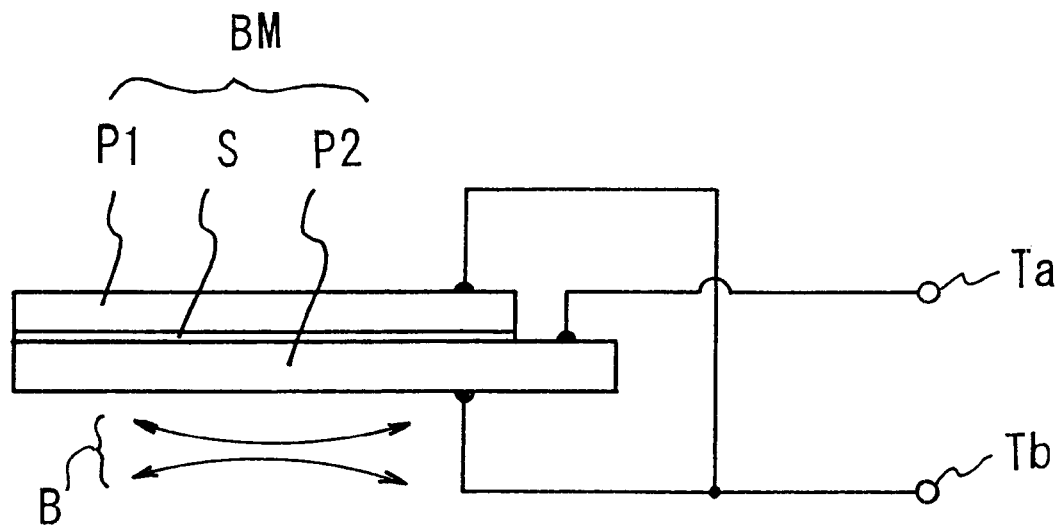
FIG. 10A illustrates the structure of a Parallel bimorph actuator.
Figure 10B:
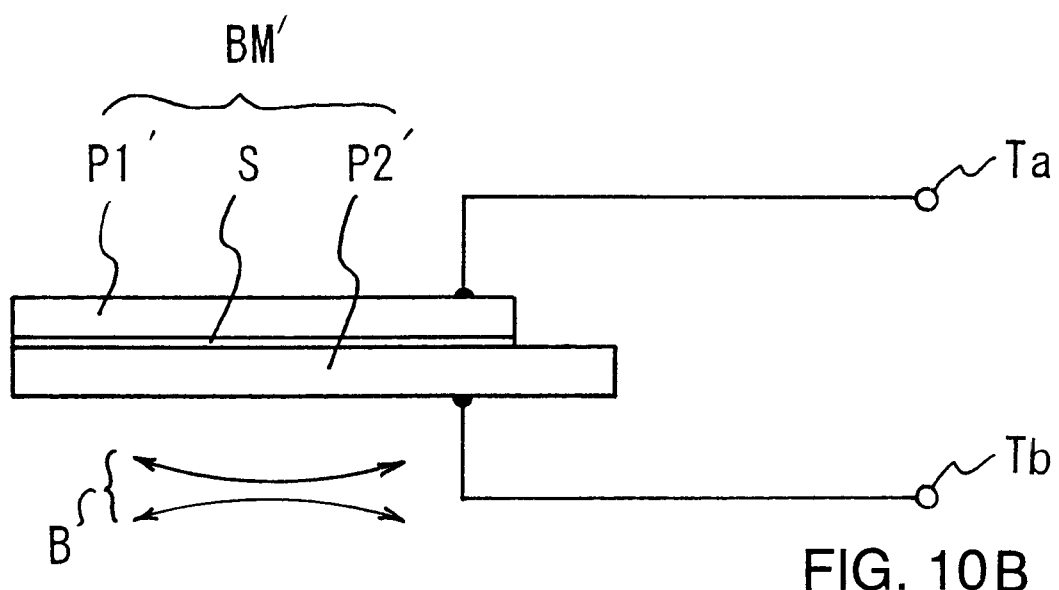
FIG. 10B illustrates the structure of a series bimorph actuator.

The bimorph actuator may assume the structure illustrated in either FIG. 10A or 10B. To explain the bimorph actuator in reference to FIG. 10A, the parallel type bimorph actuator BM is constituted by clamping a metal plate S with two piezoelectric ceramics P1 and P2. In this structure, the piezoelectric ceramics P1 and P2 are placed one on top of the other so that their polarities are set in opposite directions. By applying a voltage between a terminal Tb connected to the outer surfaces of the piezoelectric ceramics P1 and P2 and a terminal Ta connected to the joining surfaces of the piezoelectric ceramics P1 and P2, a deformation as indicated by the arrows B is caused at the bimorph actuator BM.

In FIG. 10B illustrating the structure of a series type bimorph actuators BM', the bimorph actuators BM' is constituted by clamping a metal plate S with two piezoelectric ceramics P1' and P2'. The piezoelectric ceramics P1' and P2' are placed one on top of the other so that their polarities are set in the same direction, i.e., they are set in series. By applying a voltage between an electrode Ta connected to the outer surface of the piezoelectric ceramics P1' and an electrode Tb connected to the outer surface of the piezoelectric ceramics P2', a deformation as indicated by the arrows B is caused at the bimorph actuators BM'. It is to be noted that while the following explanation is given on an example in which the bimorph actuator is constituted of the parallel type bimorph actuators BM, the series type bimorph actuators BM' may be utilized in place of the parallel type bimorph actuators BM.

Again in reference to FIG. 9A, a controller 230 is connected between the displacement sensors PS and the bimorph actuator BM. Based upon the signal output by the displacement sensor which indicates the quantity of strain in the member M, the controller 230 applies a voltage to the bimorph actuators BM in the direction in which the strain is canceled out. In response to the voltage applied by the controller 230, the bimorph actuators BM tries to deform and this function as the damping force for the member M.

In FIG. 9B, which illustrates the system shown in FIG. 9A as a vibration model, the member M is expressed by using a modal mass m, a modal stiffness Km and a modal damping Dm. Namely, when the force F is imparted to the member M and a vibration occurs along the direction indicated by the arrows Biv, this vibration is damped through the effect of the modal damping Dm that the member itself achieves even without the function of the bimorph actuator BM, and the vibration in the member M becomes settled after a certain length of time. However, the vibration does not become settled promptly. By utilizing the vibration eliminator comprising the sensor PS, the controller 230 and the bimorph actuator BM, the length of time to elapse before the vibration occurring in the member M becomes settled can be greatly reduced, as explained below.

The displacement sensors PS detects the strain occurring in the area along the length L at the member M. For instance, if the portion of the member M having the length L becomes stretched (displaced) by ΔL, the displacement sensors PS outputs a signal indicating a quantity in proportion to the strain $\epsilon(=\Delta L/L)$.

Figure 11:
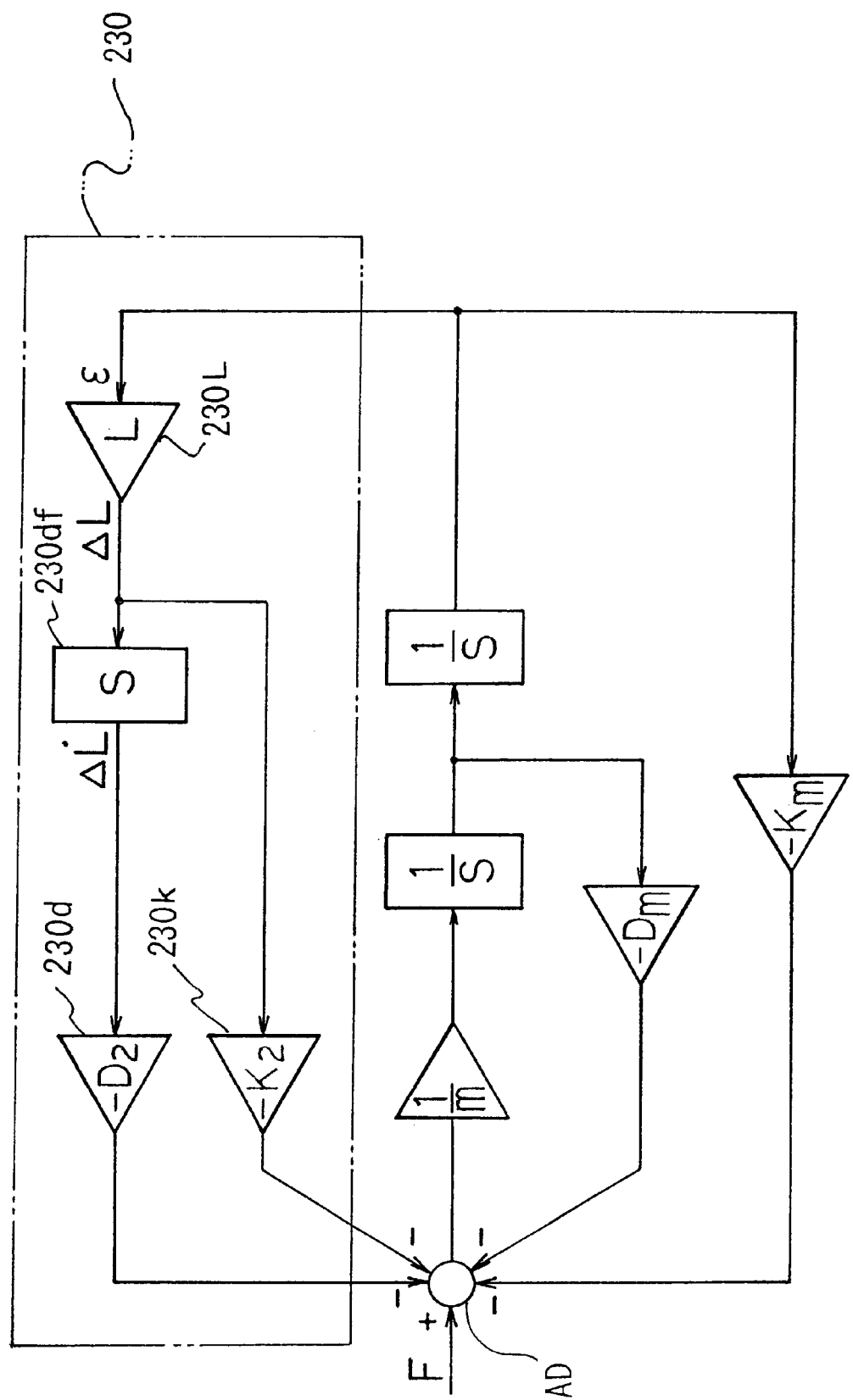
FIG. 11 is a block diagram of the components and the vibration eliminator shown in FIG. 9A.

FIG. 11 is a block diagram of the vibration elimination control system corresponding to the vibration model in FIG. 9B. In FIG. 11, the controller 230 enclosed by the two-point chain line is added to the vibration elimination control system with a self-equilibrium through the modal mass m, the modal stiffness Km and the modal damping Dm of the member M itself. The controller 230 comprises a multiplier 230L that multiplies the signal indicating the quantity of strain$\epsilon$ in the member M input from the displacement sensors PS by a gain L and the differentiator 230df that differentiates the signal output by the multiplier 230L. The controller 230 further comprises a multiplier 230d that multiplies the signal output by the differentiator 230df by a gain −D2 and a multiplier 230k that multiplies the signal output by the multiplier 230L by a gain −K2.

The signal output by the displacement sensors PS (see FIG. 9B) in correspondence to the strain quantity at the member M is input to the multiplier 230L, where it is multiplied by the gain L to obtain the displacement quantity ΔL at the member M. The signal output by the multiplier 230L is input to the differentiator 230df and the multiplier 230k. The differentiator 230df is connected to the multiplier 230d and, thus, the deformation velocity of the member M ascertained by the differentiator 230df is multiplied by the gain −D2 and the results are output to an adder AD. In other words, the gain −D2 functions as a damper. The signal output by the multiplier 230L is also input to the multiplier 230k where it is multiplied by the gain −K2, and the results are output to the adder AD. In other words, the gain −K2 functions to equivalently improve the rigidity of the member M. It is to be noted that the multipliers, the differentiator, the adder and the like explained above may be each constituted of an analog circuit or their operations may be achieved through digital processing performed by a computer. Alternatively, they may be constituted by combining analog circuits and a computer as appropriate.

With the vibration eliminator constituted of the displacement sensors PS, the controller 230 and the bimorph actuators BM as described above, a vibration occurring at the member M can be settled within a short period of time.

The following is an explanation of the advantages achieved by the vibration eliminator described above, given in reference to FIGS. 12A, 12B and 13. FIGS. 12A and 12B are frequency response diagrams of the vibration eliminator described above, with FIG. 12A showing the gain and 12B showing the phase delay respectively.

Figure 12A:
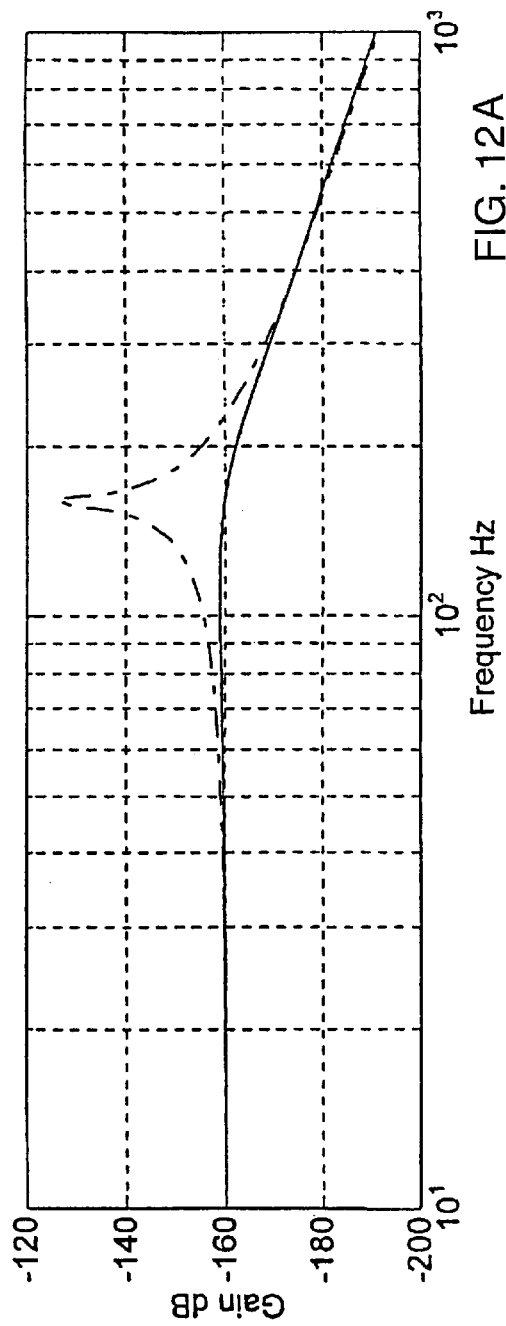
FIG. 12A presents the frequency response gain of the vibration eliminator utilized in the exposure apparatus in the third embodiment.
Figure 12B:
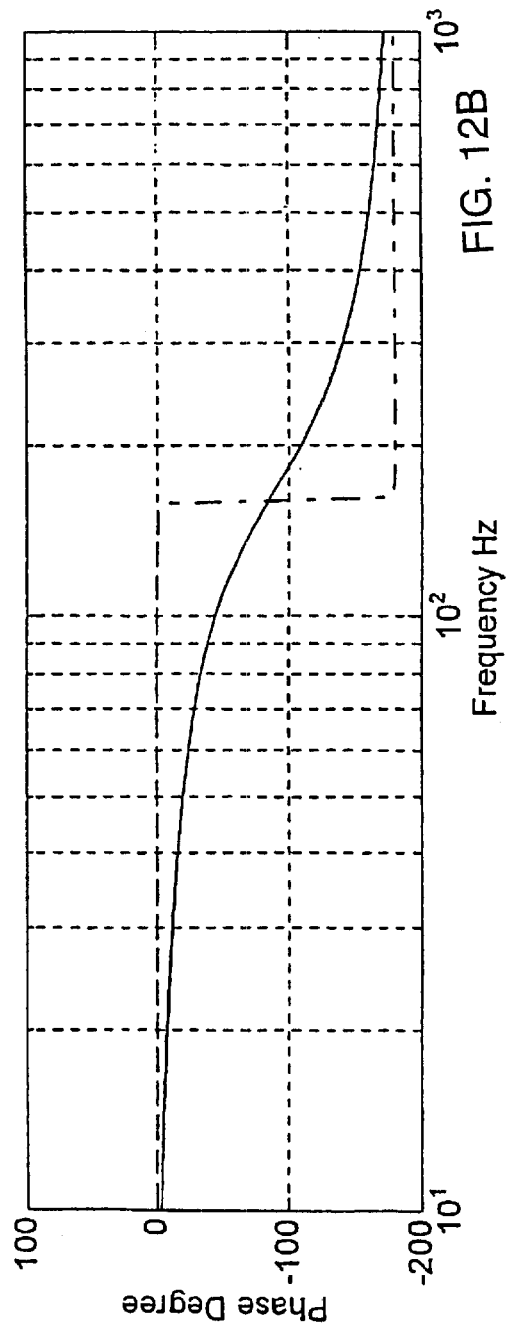
FIG. 12B illustrates the phase delay in the frequency response.

In the graphs in FIGS. 12A and 12B, the one-point chain lines represent a case in which the vibration eliminator is not engaged and the solid lines represent a case in which the vibration eliminator is engaged. As FIGS. 12A and 12B clearly indicate, a vibration occurring in the member M can be reduced with a high degree of the effectiveness by employing the above-noted vibration eliminator.

Figure 13:
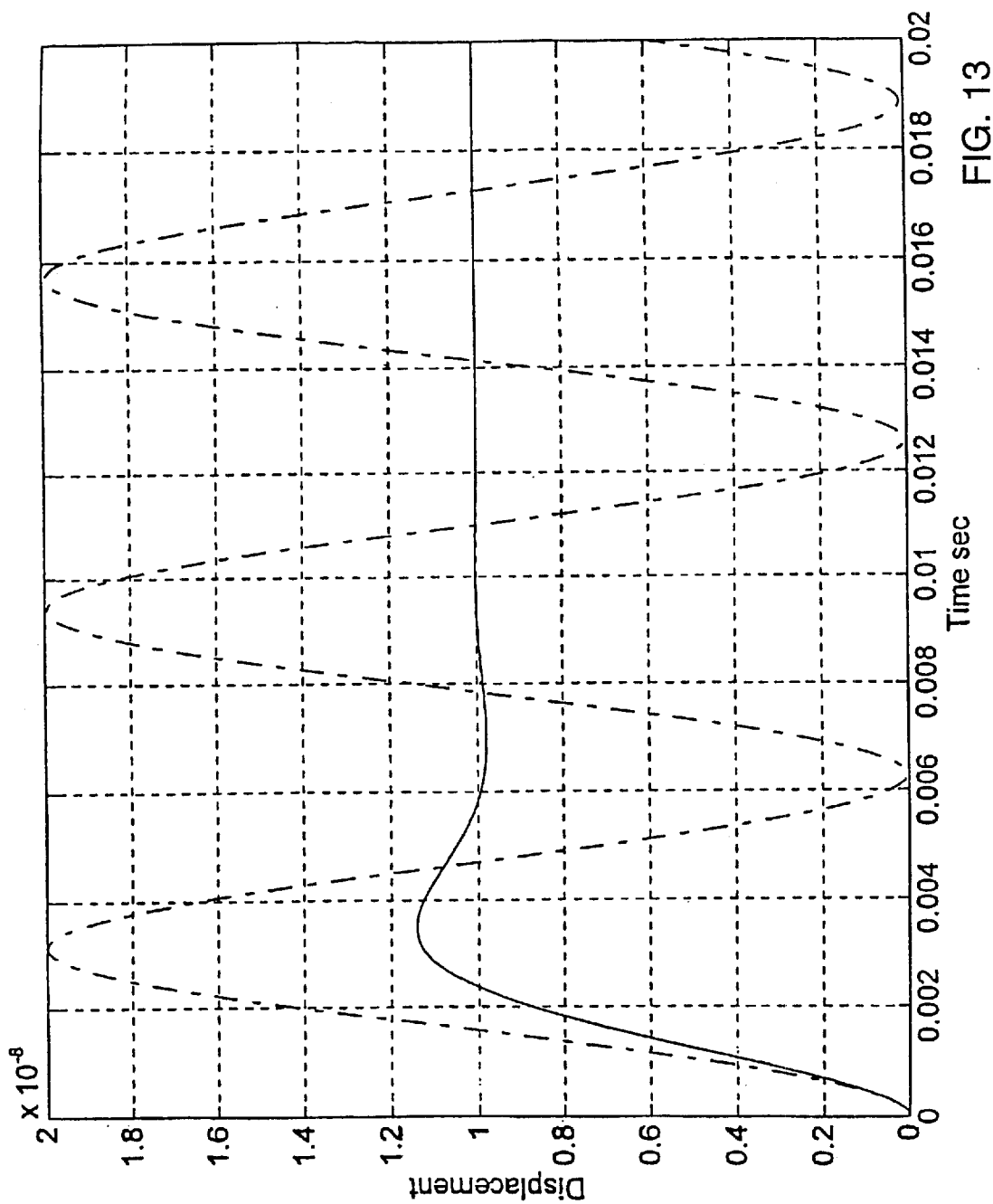
FIG. 13 shows the response to the step input at the vibration eliminator utilized in the exposure apparatus in the third embodiment.

FIG. 13 illustrates the transient characteristics of a vibration in the member M manifesting when a given level of force is imparted to the member M in steps. In the graph in FIG. 13, the one-point chain line represents a case in which the vibration eliminator is not engaged and the solid line represents a case in which the vibration eliminator is engaged. It is clear that when the above-noted vibration eliminator is functioning, the vibration becomes settled within a very short period of time. FIG. 13 also indicates that when the vibration eliminator is not engaged, a great length of time elapses before the vibration becomes settled although the amplitude of the vibration that has occurred becomes gradually reduced over time.

Figure 14:
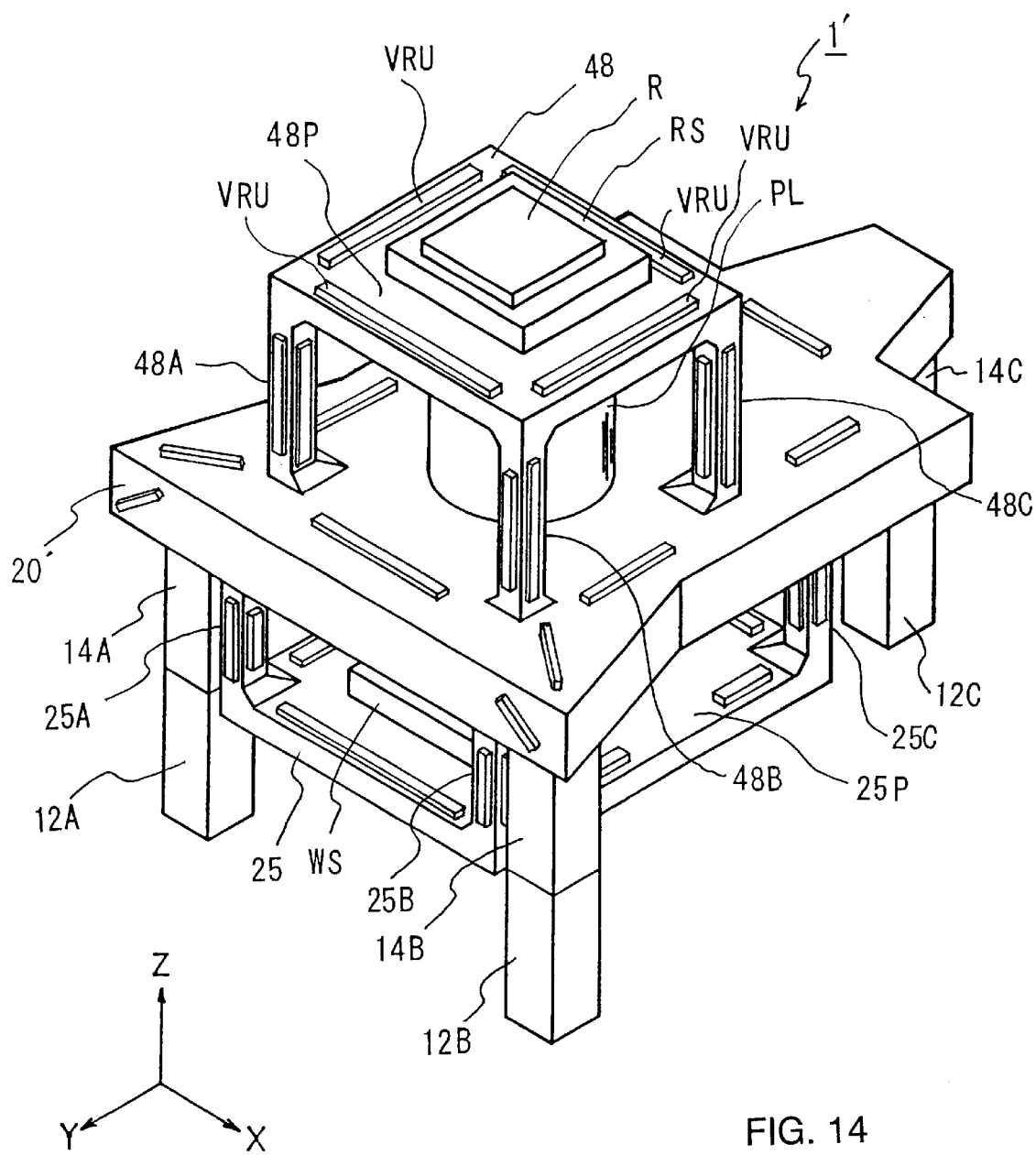
FIG. 14 illustrates a schematic structure of the exposure apparatus in the third embodiment of the present invention.
Figure 15:
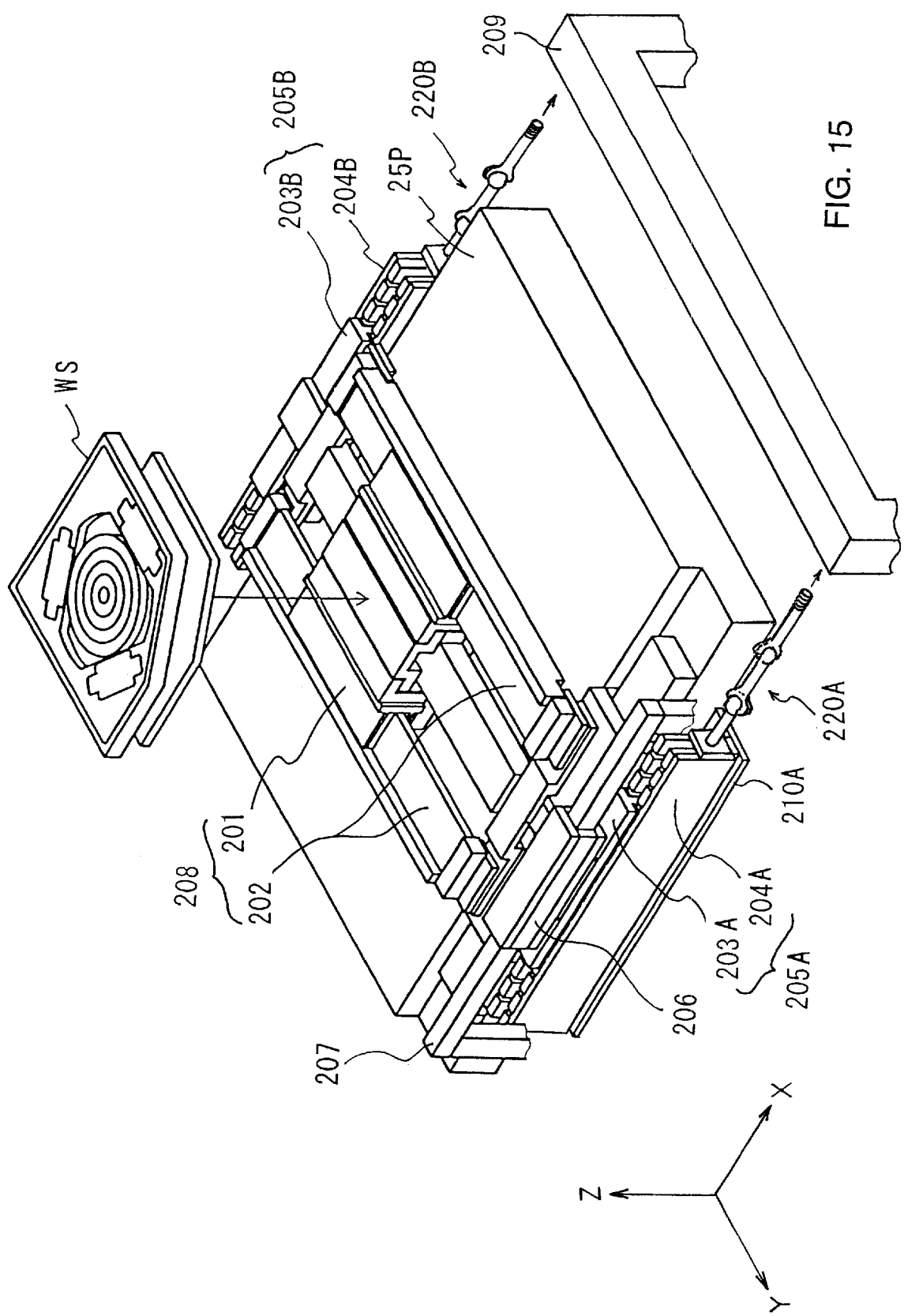
FIG. 15 is a partial view, illustrating the lower base portion of the exposure apparatus in the third embodiment of the present invention.

FIG. 14 schematically illustrates an exposure apparatus 1' that employs the vibration eliminator in the third embodiment. In FIG. 14 and also in FIG. 15 which is to be referred to in a later explanation, a Z axis is taken parallel to the optical axis of the projection optical system PL, and an X axis is taken parallel to the direction in which the base of the triangular fundamental base 20' extends within a plane extending perpendicular to the Z axis and a Y axis is taken along the direction perpendicular to the direction of the X axis. In addition, it is to be noted that in the following explanation, the directions of the arrows indicating the X, Y and Z axes in FIG. 14 and FIG. 15 are referred to as a +X direction, a +Y direction and a +Z direction respectively and directions opposite from them are distinguished from them and referred to as a −X direction, a −Y direction and a −Z direction as necessary.

In the exposure apparatus explained in reference to the first the embodiment, the quadrangular fundamental base 20 is supported by the four sets of VCMs 12A~12D and air mounts 14A~14D as shown in FIG. 1. The fundamental base 20' of the exposure apparatus 1' in this embodiment, however, is formed in a roughly triangular shape and is supported by three sets of VCMs 12A~12C and air mounts 14A~14 C. In addition, the fundamental base 20' is set so that the base portion of the triangular shape is positioned to the front of the apparatus.

Since the VCMs12A~12C are structured identically to one another and the air mounts 14A~14C are structured identically to one another, the VCMs 12A~12C and the air mounts 14A~14C are explained below by categorically referring to them as a VCM 12 and an air mount 14 respectively.

The VCM12, which comprises a fixed part, a movable part and the like, generates a thrust along the Z direction in correspondence to the voltage applied by a control unit (not shown). The air mount 14 generates thrust in the Z direction in correspondence to the air pressure supplied by an air pressure source (not shown). The VCM 12 and the air mount 14 are connected in series to support the fundamental base 20'. By adopting the structure described above, vibrations communicated from the installation floor surface to the fundamental base 20' are reduced.

A column 48 is secured onto the fundamental base 20' and also a lower base 25 is secured to the bottom of the fundamental base 20'. A vibration eliminator VRU Illustrated as the rectangular parallelepiped member in FIG. 14 is secured at each critical point in the members constituting the exposure apparatus 1'. It is to be noted that in FIG. 14 the reference code VRU is assigned to only four vibration eliminators secured onto a plate portion 48P of the column 48.

FIG. 15 schematically illustrates the structure of the drive mechanism for a wafer stage WS mounted on a plate portion 25P of the lower base 25. While the plate portion 25P is suspended and supported under the fundamental base 20' by four posts 25A~25D (see FIG. 14). The post 25D located at the far end of the drawing is not shown in FIG. 14, and illustration of these posts 25A~25D is omitted in FIG. 15.

A supporting member 210A and a supporting member 210B are secured at the ends along the +Y direction and the −Y direction of the plate portion 25P respectively. The supporting member 210B located at the far end of the drawing is not shown in FIG. 15. On these supporting members 210A and 210B, X fixed parts 204A and 204B are supported by a air static pressure guides in such a manner that they can move freely along the ±X direction respectively. The X fixed parts 204A and 204B are respectively mounted with X movable elements 203A and 203B. The X movable elements 203A and 203B travel along the ±X direction by becoming magnetically lifted relative to the X fixed parts 204A and 204B respectively. In other words, the X fixed part 204A and the X movable element 203A, and the X fixed part 204B and the X movable element 203B respectively constitute X linear motors 205A and 205B.

A Y movable element 201 is mounted at a Y fixed part 202 in such a manner that it can move along the ±Y direction and it travels along the ±Y direction by being magnetically lifted relative to the Y fixed part 202. In other words, the Y movable element 201 and the Y fixed part 202 constitute a Y linear motor 208. The wafer stage WS is secured onto the Y movable element 201.

The end of the Y fixed part 202 along the +Y direction is secured to the X movable element 203A and its end along the −Y direction is secured onto the X movable element 203B. Thus, the wafer stage WS is driven along the ±X direction and the ±Y direction in the state in which it is magnetically lifted off the plate portion 25P by the X linear motor 205A and the Y linear motor 208.

When the wafer stage WS is driven over the plate portion 25D, the wafer stage WS engages in a movement accompanied by acceleration/deceleration and, as a result, reactive forces along the ±X direction are imparted to the X fixed parts 204A and 204B of the X linear motors 205A and 205B. Likewise, a reactive force along the ±Y direction is imparted to the Y fixed part 202 of the Y linear motor 208. When these reactive forces are communicated to the plate portion 25P, the plate portion 25P vibrates, which causes a reduction in the exposure accuracy of the exposure apparatus. In order to lessen the degree to which the exposure accuracy becomes reduced in this manner, the exposure apparatus in the embodiment is provided with a reactive force release mechanism, which is explained below.

When the reactive force is imparted to the fixed parts 204A and 204B which are supported on the supporting members 210A and 210B by the air static pressure guides as described earlier, the X fixed parts 204A and 204B will be inclined to move along the ±X direction. However, the X fixed parts 204A and 204B are secured onto an X reaction frame 209 which is locked onto the installation floor surface via ball joints 220A and 220B respectively. As a result, the reactive forces imparted to the X fixed parts 204A and 204B are received by the X reaction frame 209 and no vibration occurs at the plate portion 25P.

In addition, a guide member 206 is secured to the end of the Y fixed part 202 along the +Y direction. The guide member 206 is supported by a Y reaction frame 207 locked on to the installation floor surface via an air static pressure guide in such a manner that the guide member 206 can move freely along the ±X direction. The reactive force imparted to the Y fixed part 202 while the wafer stage WS repeatedly stops and moves along the Y direction is received by the Y reaction frame 207 via the guide member 206, and thus, no vibration occurs at the plate portion 25P.

It is to be noted that although not shown in FIGS. 14 and 15, a similar reactive force receiving structure also provided at the reticle stage RS.

In the exposure apparatus 1' adopting the structure described above, vibrations communicated from the installation floor surface are isolated by the VCMs 12A~12C and the air mounts 14A~14C and the reactive forces generated when the wafer stage WS and the reticle stage RS repeat stop/start are communicated to the installation floor surface so that vibrations occurring at the fundamental base 20', the column 48 and the lower base 25 are reduced.

However, even when the structure described above is adopted, a slight vibration may occur or a slight residual vibration may be present in the exposure apparatus 1', resulting in a reduction in the exposure accuracy. Typical causes of such a slight vibration include the following.

Firstly, the reactive forces imparted to the X reaction frame 209 and the Y reaction frame 207 cause the X reaction frame 209 or 207 to vibrate, and this vibration is communicated from the installation floor surface to the VCMs 12A~12C and the air mounts 14A~14C. The vibration may not always be completely isolated by the VCMs 12A~12C and the air mounts 14A~14C, resulting in a slight vibration occurring at the fundamental base 20'.

Secondly, as the wafer stage WS and the reticle stage RS move, the position of the center of gravity of the entire exposure apparatus 1' may change. While the inclination of the exposure apparatus 1' which starts to occur as a result of the change in the position of the center of gravity is reduced by the presence of the VCMs 12A~12C and the air mounts 14A~14C, a slight vibration may still occur at this time. This vibration may pose a problem depending upon the degree of accuracy required of the exposure apparatus.

Accordingly, in the exposure apparatus 1' in the embodiment, the vibration eliminators VRU explained earlier are mounted at the column 48 and the lower base 25 secured to the vibration eliminating base comprising the VCMs 12A~12C, the air mounts 14A~14C and the fundamental base 20', or at strategically appropriate positions of the members constituting the exposure apparatus 1'.

FIG. 16A is a front view of an example of a member constituting the exposure apparatus 1'. FIG. 16B is a side elevation of the member M shown in FIG. 16A. As illustrated in FIGS. 16A and 16B, vibration eliminators VRU are secured at positions at which vibrations occurring at the member M are effectively reduced. In the example illustrated in FIGS. 16A and 16B, the bimorph actuators BM and the displacement sensors PS constituting each vibration eliminator VRU are secured to one of the side surfaces of the member M. When the member M vibrates, the member M becomes bent as indicated by the arrows B and, as result, a displacement occurs. The displacement sensors PS detect this displacement (strain) and a voltage that corresponds to the level of the force required to reduce the displacement is applied to the bimorph actuators BM by the controller 230 (see FIG. 9A).

It is to be noted that the displacement sensors PS may be mounted on both sides instead of on one side of the member M. In addition, the sizes of the displacement sensors PS and the bimorph actuators BM are not limited to those in the example in FIGS. 16A and 16B. In other words, no restrictions are imposed with respect to the size of the displacement sensors PS as long as the size is suitable for detection of displacement occurring at the member M, and likewise no special restrictions are imposed with regard to the size of the bimorph actuators BM as long as the size is suited to reduce vibrations of the member M or displacement resulting from vibrations of the member M. For instance, if higher harmonic vibrations other than vibrations of degree 0 among the various modes of vibrations occurring at the member M are a problem, the displacement sensors PS and the bimorph actuators BM should be mounted at positions on the member M corresponding to the location of the antinode of the vibration. In other words, it is desirable to mount the displacement sensors PS and the bimorph actuators BM at positions or near positions at the member M where the displacement resulting from a vibration manifests to the greatest degree.

FIG. 16C is a side elevation of the member M in FIG. 16A, with piezoelectric actuators PA along with the displacement sensors PS mounted at the two surfaces of the member M. The piezoelectric actuators PA in FIG. 16C are each constituted of an actuator capable of stretching along the vertical direction in the figure in correspondence to the level of the voltage applied to it. While these piezoelectric actuators PA themselves do not undergo bending deformation as do the bimorph actuators BM, they can be used to reduce the degree of displacement occurring at the member M due to a vibration along the horizontal direction by, for instance, causing only the piezoelectric actuators PA secured on one side of the member M to generate a stretching force or by causing the piezoelectric actuators PA secured on one side of the member M to generate a contracting force and causing the piezoelectric actuators PA secured onto the other side of the member M to impart an expanding force.

In addition, while an example in which a horizontal vibration occurring at the member M is reduced is explained above, it is also possible to reduce vertical vibrations or torsional vibrations. Namely, by generating expanding forces or contracting forces at the same level through a pair of piezoelectric actuators PA secured onto the two sides of the member M in the example illustrated in FIG. 16C, the degree to which the member M stretches as a result of a vertical vibration is reduced and, as a result, the vibration in the member M is settled within a short period of time.

Torsional vibrations occurring at the member M may be reduced by positioning the piezoelectric actuators PA so that the direction of their contracting forces or expanding forces is roughly aligned with the direction of the main stress at the member M. In addition, the bimorph actuators BM illustrated in FIGS. 16A and 16B and the piezoelectric actuators PA shown in FIG. 16C may be mounted in combination at a single member M if necessary.

While the explanation is given above on an example in which the vibration eliminators VRU are secured onto the surface of the member M, the vibration eliminators VRU may be installed inside the member instead, or the vibration eliminators VRU may be installed in a diagonal pattern among a plurality of members.

As explained above, in this embodiment, any great vibration occurring at the exposure apparatus 1' due to reactive forces occurring while the wafer stage WS and the reticle stage RS repeatedly stop and start is reduced by the X linear motors 205A and 205B, the X reaction frame 209, the Y linear motor 208, the Y reaction frame 207 and the like in addition to the vibration eliminating effect achieved through the VCMs 12A–12C and the air mounts 14A–14C.

Furthermore, vibrations occurring while the exposure apparatus 1' is engaged in an operation are greatly reduced thanks to a vibration eliminating effect by which vibrations of the members constituting the structure are reduced by the vibration eliminators VRU. As a result, the exposure accuracy is greatly improved.

In the explanation given above, the vibration eliminators VRU are each constituted as a so-called active vibration eliminator that generates a bending force, an expanding force or a contracting force through the bimorph actuators BM or the piezoelectric actuators PA in correspondence to the displacement (strain) detected in the member M so as to reduce the displacement (strain). As an alternative, a passive vibration eliminator such as that explained in reference to the second embodiment may be adopted. Or, active vibration eliminators and passive vibration eliminators may both be mounted at a single member to utilize the passive vibration eliminators alone if the vibration is smaller than a predetermined level and to switch to the active vibration eliminators when the vibration is larger than the predetermined level, or the passive vibration eliminators and the active vibration eliminators may be engaged in combination.

While the displacement sensors PS are each constituted of a piezoelectric sensor and the bimorph actuators BM or the piezoelectric actuators PA are each constituted of a piezoelectric ceramic in the vibration eliminators VRU explained above, other types of sensors or actuators may be utilized to constitute them.

In addition, while an example in which vibrations at the members are reduced through so-called feedback control is explained above, vibrations may be reduced through feed forward control instead. Namely, vibrations occurring at the members as a result of movement of the reticle stage RS and the like may be ascertained in advance through testing and a bending force, an expanding force or a contracting force, the level of which corresponds to the level of the vibration expected to occur as the reticle stage RS is driven in a given direction may be generated through the bimorph actuators BM or the piezoelectric actuators PA.

What is claimed is:

1. A vibration eliminator comprising:

a supporting member;

a supported member that is supported by said supporting member;

a first drive device provided between said supporting member and said supported member, that generates a driving force along a support direction in which said supporting member supports said supported member;

a second drive device connected to said supporting member to drive said supporting member along the support direction;

a first vibration detector provided at said supporting member to detect a vibration of said supporting member along the support direction;

a second vibration detector provided at said supported member to detect a vibration of said supported member along the support direction;

a displacement detector provided at said supporting member to detect a displacement of said supporting member; and a damping control circuit that controls the driving force generated by said first drive device based upon vibrations detected by said first vibration detector and said second vibration detector and controls said second drive device.

2. A vibration eliminator according to claim 1, wherein:

said damping control circuit controls the driving force generated by said first drive device based upon the vibration detected by said first vibration detector and said second vibration detector by employing a velocity feedback loop constituted of an integrating circuit and a velocity control circuit to reduce relative vibration occurring between said supporting member and said supported member.

3. A vibration eliminator according to claim 1, further comprising:

a fixed body secured to an installation floor surface; and a damping drive device that is provided between said supporting member and said fixed body or between said supported member and said fixed body, wherein:

said damping control circuit controls a driving force generated by said damping drive device based upon the results of detection of a vibration occurring at said supporting member or results of detection of a vibration occurring at said supported member.

4. An exposure apparatus that exposes an object mounted on a stage with a predetermined pattern of a mask via a projection optical system, comprising:

a supporting member having a first portion and a second portion, said first portion holding said projection optical system;

a supported member that is supported by said second portion of said supporting member, said supported member holding said mask;

a first drive device provided between said supporting member and said supported member, that generates a driving force along an optical axis of said projection optical system to move said mask relative to said projection optical system;

a first vibration detector provided at said supporting member to detect a vibration of said supporting member along the optical axis;

a second vibration detector provided at said supported member to detect a vibration of said supported member along the optical axis; and a damping control circuit that controls the driving force generated by said first drive device based upon vibrations detected by said first vibration detector and said second vibration detector.

5. An exposure apparatus according to claim 4, wherein:

said supported member movably holds said object.

6. An exposure apparatus according to claim 4, wherein:

the exposure apparatus is a scanning exposure apparatus.

7. An exposure apparatus according to claim 4, further comprising:

a second drive device that drives said mask in a first horizontal direction; and a third drive device that drives said mask in a second horizontal direction different from the first horizontal direction.

8. An exposure apparatus according to claim 7, further comprising:

a first interferometer system that detects a position of said mask in the first horizontal direction; and a second interferometer system that detects a position of said mask in the second horizontal direction.

9. A projection exposure method for exposing an object mounted on a stage with a predetermined pattern of a mask via a projection optical system, comprising the steps of:

providing a supporting member having a first portion that holds said projection optical system and a second portion that supports a supported member;

detecting a vibration occurring in said supporting member along an optical axis of said projection optical system;

detecting a vibration occurring in said supported member along the optical axis, said supported member holding said mask; and controlling an output of a first drive device provided between said supporting member and said supported member based upon results of detection of the vibrations to drive said mask relative to said projection optical system in said optical axis;

wherein relative vibration occurring between said supporting member and said supported member is reduced.

10. A projection exposure method according to claim 9, further comprising the steps of controlling an output from a damping drive device provided between said supporting member and a fixed body or between said supported member and said fixed body based upon the results of detection of a vibration occurring in said supporting member or the results of detection of a vibration occurring in said supported member.

11. A projection exposure method according to claim 9, wherein:

said supporting member movably supports said object.

12. A projection exposure method according to claim 9, further comprising the steps of:

driving said mask in a first horizontal direction; and driving said mask in a second horizontal direction different from the first horizontal direction.

13. A projection exposure method according to claim 12, further comprising the steps of:

detecting a position of said mask in the first horizontal direction by a first interferometer system; and detecting a position of said mask in the second horizontal direction by a second interferometer system.

* * * * *

UNITED STATES PATENT AND TRADEMARK OFFICE
CERTIFICATE OF CORRECTION

PATENT NO.   : 6,522,388 B1
DATED        : February 18, 2003
INVENTOR(S)  : Masato Takahashi It is certified that error appears in the above-identified patent and that said Letters Patent is hereby corrected as shown below:

<u>Title page</u>,
Item [75], please replace the Inventors so Item [75] reads:
-- [75] Iventor: Masato Takahashi, Tokyo (JP) --

Signed and Sealed this

Eleventh Day of November, 2003

JAMES E. ROGAN
*Director of the United States Patent and Trademark Office*